(12) United States Patent
Jeong et al.

(10) Patent No.: US 9,553,613 B2
(45) Date of Patent: Jan. 24, 2017

(54) TRANSMITTER AND PUNCTURING METHOD THEREOF

(71) Applicant: SAMSUNG ELECTRONICS CO., LTD., Suwon-si (KR)

(72) Inventors: Hong-sil Jeong, Suwon-si (KR); Se-ho Myung, Yongin-si (KR); Kyung-joong Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 135 days.

(21) Appl. No.: 14/489,702

(22) Filed: Sep. 18, 2014

(65) Prior Publication Data

US 2015/0082132 A1   Mar. 19, 2015

Related U.S. Application Data

(60) Provisional application No. 61/879,273, filed on Sep. 18, 2013.

(51) Int. Cl.
*H03M 13/00* (2006.01)
*H03M 13/29* (2006.01)
(Continued)

(52) U.S. Cl.
CPC ..... *H03M 13/6362* (2013.01); *H03M 13/2906* (2013.01); *H03M 13/618* (2013.01);
(Continued)

(58) Field of Classification Search
CPC ............ H03M 13/618; H03M 13/6362; H03M 13/2906; H03M 13/09; H03M 13/1165; H03M 13/27; H03M 13/152; H03M 13/1102; H03M 13/1185; H04L 1/0042; H04L 1/0048; H04L 1/0065; H04L 1/0071; H04L 1/007; H04L 2001/0093; H04H 20/57; H04H 20/71; H04B 1/0475
See application file for complete search history.

(56) References Cited

U.S. PATENT DOCUMENTS

2007/0022356 A1   1/2007 Li
2007/0041458 A1   2/2007 Hocevar et al.
(Continued)

FOREIGN PATENT DOCUMENTS

KR   1020100103019 A   9/2010
KR   1020130024704 A   3/2013

OTHER PUBLICATIONS

International Search Report issued on Dec. 16, 2014 by the International Searching Authority in related application No. PCT/KR2014/008716.
(Continued)

*Primary Examiner* — Guerrier Merant
(74) *Attorney, Agent, or Firm* — Sughrue Mion, PLLC

(57) ABSTRACT

Provided are a transmitter for processing an L1 signaling including an L1-pre signaling and an L1-post signaling, a receiver of the L1 signaling, and methods of controlling the transmitter and the receiver. The transmitter includes: an encoder configured to perform Bose, Chaudhuri, Hocquenghem (BCH) encoding and Low Density Parity Check (LDPC) encoding with respect to the L1-post signaling, and a puncturing unit configured to puncture at least a part of LDPC parity bits constituting an LDPC codeword generated by the LDPC encoding of the L1-post signaling, wherein the number of bits to be punctured is calculated based on the number of bits available for transmission of the LDPC codeword and a modulation order of the L1-post signaling.

20 Claims, 16 Drawing Sheets

(51) Int. Cl.
  *H03M 13/11*   (2006.01)
  *H03M 13/15*   (2006.01)
  *H03M 13/09*   (2006.01)
  *H03M 13/27*   (2006.01)

(52) U.S. Cl.
  CPC ........ *H03M 13/09* (2013.01); *H03M 13/1102* (2013.01); *H03M 13/1165* (2013.01); *H03M 13/152* (2013.01); *H03M 13/27* (2013.01)

(56) References Cited

U.S. PATENT DOCUMENTS

| | | |
|---|---|---|
| 2009/0259913 A1 | 10/2009 | Myung et al. |
| 2010/0232544 A1 | 9/2010 | Myung et al. |
| 2011/0119568 A1* | 5/2011 | Jeong ................ H03M 13/1185 714/790 |
| 2011/0138262 A1* | 6/2011 | Myung ............... H03M 13/036 714/806 |
| 2013/0055051 A1 | 2/2013 | Jeong et al. |
| 2015/0078473 A1* | 3/2015 | Ko ....................... H04L 1/0042 375/267 |

OTHER PUBLICATIONS

Written Opinion issued on Dec. 16, 2014 by the International Searching Authority in related application No. PCT/KR2014/008716.

\* cited by examiner

TRANSMITTER AND PUNCTURING METHOD THEREOF

CROSS-REFERENCE TO RELATED APPLICATIONS

This application claims priority from Korean Patent Application No. 10-2014-0065370, filed on May 29, 2014, in the Korean Intellectual Property Office, and U.S. Provisional Application No. 61/879,273, filed on Sep. 18, 2013, in the U.S. Patent and Trademark Office, the disclosures of which are incorporated herein in their entirety by reference.

BACKGROUND

1. Field

Apparatuses and methods consistent with exemplary embodiments relate to a transmitter and a puncturing method thereof, and more particularly, a transmitter and a puncturing method thereof which punctures at least a part of parity bits of a Low Density Parity Check (LDPC) codeword.

2. Description of the Related Art

In the 21st century information-oriented society, broadcasting communication services are moving into the era of digitalization, multi-channel, wideband, and high quality. In particular, as high quality digital televisions and portable multimedia players and portable broadcasting equipment are increasingly used in recent years, there is an increasing demand for methods for supporting various receiving methods of digital broadcasting services.

In order to meet such demand, standard groups are establishing various standards and are providing a variety of services to satisfy users' needs. However, there is still a demand for a method for providing improved services to users with higher transmission and reception performance.

SUMMARY

One or more exemplary embodiments address at least the above problems by providing a transmitter and a puncturing method thereof which transmits an Low Density Parity Check (LDPC) codeword of an L1-post signaling after puncturing at least a part of parity bits of the LDPC codeword considering the number of LDPC codeword bits available for mapping onto a preamble symbol and a modulation order of the L1-post signaling.

According to an aspect of an exemplary embodiment, there is provided a transmitter for processing L1 signaling including an L1-pre signaling and an L1-post signaling. The transmitter may include: an encoder configured to perform Bose, Chaudhuri, Hocquenghem (BCH) encoding and LDPC encoding with respect to the L1-post signaling, and a puncturing unit configured to puncture at least a part of LDPC parity bits constituting an LDPC codeword generated by the LDPC encoding of the L1-post signaling, wherein a number of bits to be punctured is calculated based on a number of bits available for transmission of the LDPC codeword and a modulation order of the L1-post signaling.

Here, the puncturing unit may calculate the number of bits available for transmission of the LDPC codeword, and calculates a number of bits which are to be temporarily punctured from the LDPC parity bits so that a number of LDPC codeword bits after the temporary puncturing of the LDPC parity bits is the same as the calculated number of bits available for transmission of the LDPC codeword.

The puncturing unit may calculate the number of bits available for transmission of the LDPC codeword, $N_{L1post\_available\_bits}$, using a following equation:

$$N_{L1post\_Available\_bits} = \left\lfloor \frac{N_{Preamble\_Available\_Cells} - N_{L1pre}/\eta_{MOD\_L1pre}}{N_{L1post\_FECFRAME}} \right\rfloor \times \eta_{MOD\_L1post},$$

where $N_{preamble\_available\_cells}$ is a number of preamble cells available for transmitting the L1 signaling, $N_{L1pre}$ is a number of bits of the L1 pre signaling, $\eta_{MOD\_L1pre}$ is a modulation order of the L1-pre signaling, $N_{L1post\_FECFRAME}$ is a number of LDPC codewords of the L1-post signaling, and $\eta_{MOD\_L1post}$ is a modulation order of the L1-post signaling.

The puncturing unit may calculate the number of bits available for transmission of the LDPC parity bits based on the number of bits available for transmission of the LDPC codeword.

The puncturing unit may calculate the number of bits available for transmission of the LDPC parity bits using a following equation:

$$N_{L1post\_Available\_parity} = N_{L1post\_Available\_bits} - K_{sig} - N_{bch\_parity},$$

where $N_{L1post\_available\_bits}$ is the number of bits available for transmission of the LDPC codeword, $K_{sig}$ is a number of bits of the L1 signaling input to the encoder, and $N_{bch\_parity}$ is a number of BCH parity bits generated by the BCH encoding.

The puncturing unit may calculate the number of bits which are to be temporarily punctured from the LDPC parity bits so that a number of the LDPC parity bits after the temporary puncturing is the same as the number of the bits available for transmission of the LDPC parity bits.

The puncturing unit may calculate the number of bits to be temporarily punctured from the LDPC parity bits, $N_{punc\_temp}$, using a following equation:

$$N_{punc\_temp} = N_{ldpc\_parity\_L1post} - N_{L1post\_Available\_parity},$$

where $N_{ldpc\_parity\_L1post}$ is a number of the LDPC parity bits before the temporary puncturing, and $N_{L1post\_available\_parity}$ is the number of bits available for transmission of the LDPC parity bits.

The puncturing unit may calculate a number of LDPC codeword bits after puncturing based on a value which is calculated by subtracting the number of LDPC parity bits to be temporarily punctured from the number of LDPC codeword bits. Here, the number of LDPC codeword bits after puncturing is a number of LDPC codeword bits which remain after the temporary puncturing and one of additional puncturing of the LDPC parity bits or adding bits having a predetermined value to the LDPC codeword bits which remain after the temporary puncturing.

The puncturing unit calculate the number of LDPC codeword bits after the puncturing using a following equation:

$$N_{L1post} = \left\lfloor \frac{N_{L1post\_temp}}{\eta_{MOD\_L1post}} \right\rfloor \times \eta_{MOD\_L1post},$$

where $N_{L1post\_temp}$ is a value which is calculated by subtracting the number of bits to be temporarily punctured from the number of LDPC codeword bits, and $\eta_{MOD\_L1post}$ is the modulation order of the L1-post signaling.

The puncturing unit calculates the number of bits punctured from the LDPC parity bits using a following equation:

$$N_{punc}=N_{punc\_temp}+(N_{L1post\_temp}-N_{L1post}),$$

where $N_{punc\_temp}$ is the number of bits temporarily punctured, $N_{L1post}$ is the number of LDPC codeword bits after puncturing, $N_{L1post\_temp}$ is a value which is calculated by subtracting the number of bits to be temporarily punctured from the number of LDPC codeword bits.

According to an aspect of another exemplary embodiment, there is provided a puncturing method of a transmitter for processing an L1 signaling including an L1-pre signaling and an L1-post signaling. The method may include: performing BCH encoding and LDPC encoding with respect to the L1-post signaling; puncturing at least a part of LDPC parity bits from an LDPC codeword generated from the LDPC encoding, wherein a number of bits punctured is calculated based on a number of bits available for transmission of the LDPC codeword and a modulation order of the L1-post signaling.

The puncturing may include: calculating the number of bits available for transmission of the LDPC codeword; and calculating a number of bits which are to be temporarily punctured from the LDPC parity bits so that a number of LDPC codeword bits after the temporary puncturing of the LDPC parity bits is the same as the calculated number of bits available for transmission of the LDPC codeword.

The number of bits available for transmission of the LDPC codeword may be calculated using a following equation:

$$N_{L1post\_Available\_bits} = \left\lfloor \frac{N_{Preamble\_Available\_Cells} - N_{L1pre}/\eta_{MOD\_L1pre}}{N_{L1post\_FECFRAME}} \right\rfloor \times \eta_{MOD\_L1post},$$

where $N_{preamble\_available\_cells}$ is a number of preamble cells available for transmitting the L1 signaling, $N_{L1pre}$ is a number of bits of the L1-pre signaling, $\eta_{MOD\_L1pre}$ is a modulation order of the L1-pre signaling, $N_{L1post\_FECFRAME}$ is a number of LDPC codewords of the L1-post signaling, and $\eta_{MOD\_L1post}$ is a modulation order of the L1-post signaling.

The number of bits available for transmission of the LDPC parity bits may be calculated based on the number of bits available for transmission of the LDPC codeword.

The number of bits available for transmission of LDPC parity bits may be calculated using a following equation:

$$N_{L1post\_Available\_parity}=N_{L1post\_Available\_bits}-K_{sig}-N_{bch\_parity},$$

where $N_{L1post\_available\_bits}$ is the number of bits available for transmission of the LDPC codeword, $K_{sig}$ is a number of bits of the L1 signaling input to the encoder, and $N_{bch\_parity}$ is a number of BCH parity bits generated by the BCH encoding.

The temporary puncturing of the LDPC parity bits may be performed so that a number of the LDPC parity bits after the temporary puncturing is the same as the number of bits available for transmission of the LDPC parity bits.

The number of bits to be temporarily punctured from the LDPC parity bits, $N_{punc\_temp}$, may be calculated using a following equation:

$$N_{punc\_temp}=N_{ldpc\_parity\_L1post}-N_{L1post\_Available\_parity},$$

where $N_{ldpc\_parity\_L1post}$ is a number of the LDPC parity bits before the temporary puncturing, and $N_{L1post\_available\_parity}$ is the number of bits available for transmission of the LDPC parity bits.

The puncturing may include calculating a number of LDPC codeword bits after puncturing based on a value which is calculated by subtracting the number of LDPC parity bits to be temporarily punctured from the number of LDPC codeword bits. Here, the number of LDPC codeword bits after puncturing is a number of LDPC codeword bits which remain after the temporary puncturing and one of additional puncturing of the LDPC parity bits or adding bits having a predetermined value to the LDPC codeword bits which remain after the temporary puncturing.

The number of LDPC codeword bits after the puncturing may be calculated using a following equation:

$$N_{L1post} = \left\lfloor \frac{N_{L1post\_temp}}{\eta_{MOD\_L1post}} \right\rfloor \times \eta_{MOD\_L1post},$$

where $N_{L1post\_temp}$ is a value which is calculated by subtracting the number of bits to be temporarily punctured from the number of LDPC codeword bits, and $\eta_{MOD\_L1post}$ is the modulation order of the L1-post signaling.

The puncturing may include calculating the number of bits punctured from the LDPC parity bits using a following equation:

$$N_{punc}=N_{punc\_temp}+(N_{L1post\_temp}-N_{L1post}),$$

where $N_{punc\_temp}$ is the number of bits temporarily punctured, $N_{L1post}$ is the number of LDPC codeword bits after puncturing, $N_{L1post\_temp}$ is a value which is calculated by subtracting the number of bits to be temporarily punctured from the number of LDPC codeword bits.

As described above, according to various exemplary embodiments, the L1-post signaling is efficiently transmitted to a receiving end, and thus, the receiving performance can be improved.

BRIEF DESCRIPTION OF THE DRAWINGS

The above and/or other aspects will be more apparent by describing in detail exemplary embodiments, with reference to the accompanying drawings, in which.

DETAILED DESCRIPTION OF THE EXEMPLARY EMBODIMENTS

Figure 1:
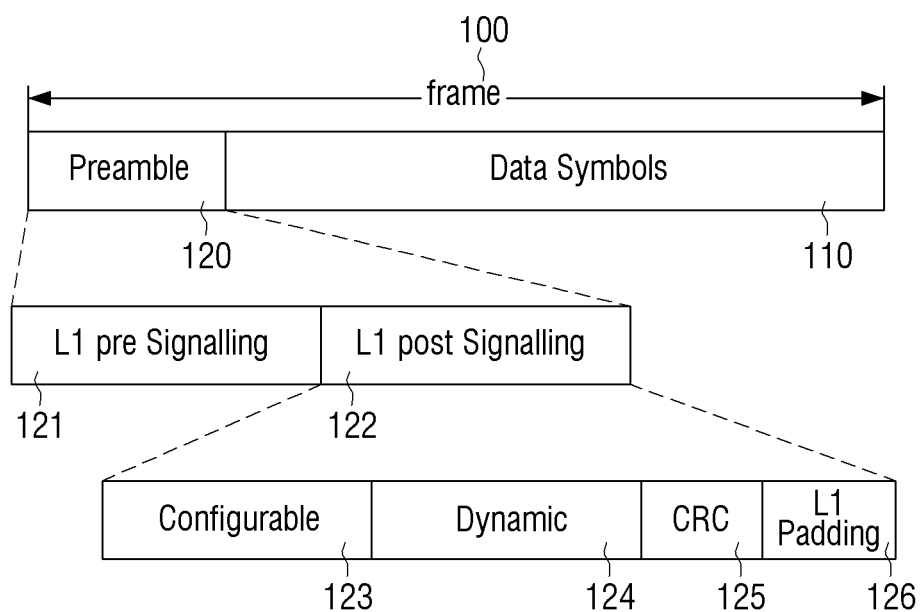
FIG. 1 is a view illustrating a frame configuration, according to an exemplary embodiment.

Hereinafter, exemplary embodiments will be described in greater detail with reference to the accompanying drawings. In the following description, same reference numerals are used for the same components when they are depicted in different drawings. The matters defined in the description, such as detailed construction and components, are provided to assist in a comprehensive understanding of the exemplary embodiments. Thus, it is apparent that these exemplary embodiments can be carried out without those specifically defined matters. Also, functions or components known in the related art are not described in detail since they would obscure the exemplary embodiments with unnecessary detail. Many of the terms used in the exemplary embodiments may be consistent with those used in the digital video broadcasting the second generation European terrestrial (DVB-T2) or the Advanced Television System Committee (ATSC) 3.0 standard.

FIG. 1 is a view illustrating a frame configuration according to an exemplary embodiment. As shown in FIG. 1, a frame 100 includes a data symbol 110 and a preamble 110. The frame 100 is an Orthogonal Frequency Division Multiplexing (OFDM) frame and is the same as a configuration using in the ATSC 3.0 standard.

The data symbol 110 is service data (for example, broadcasting data) provided to a user, and formed of more than one physical layer pipe (PLP). A different signal processing operation may be performed independently for each PLP. For example, a different modulation order and a different code rate may be used for each PLP.

A preamble 120 is a part where L1 signal is transmitted, and may include an L1-pre signaling (or L1-pre signaling information) 121 and an L1-post signaling (or L1-post signaling information) 122.

Herein, the L1-pre signaling 121 includes information needed for a receiver (not illustrated) to receive and decode the L1-post signaling 122, and the L1-post signaling 122 includes a parameter needed for the receiver (not illustrated) to access the PLPs. The L1-post signaling 122 may include L1 configurable information 123, L1 dynamic information 124, Cyclic Redundancy Checking (CRC) 125, L1 padding 126 and the like.

Exemplary embodiments described herein provide a method of processing the L1 post-signaling which is mapped onto the preamble 120 in the frame configuration as shown in FIG. 1 and transmitted to the receiver.

Hereinafter, a length of a Low Density Parity Check (LDPC) codeword, an information word, a parity, an L1-post signaling, an L1-pre signaling and the like means the number of bits included in each of them, respectively.

Figure 2A:
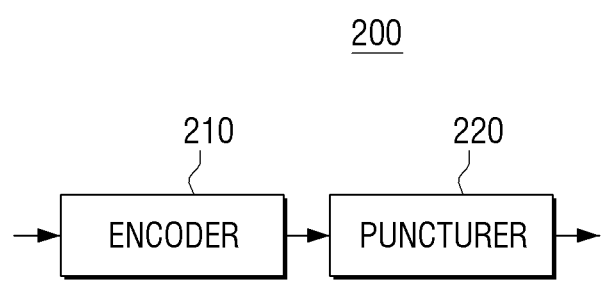
FIGS. 2A and 2B are block diagrams illustrating a configuration of a transmitter, according to an exemplary embodiment.
Figure 2B:
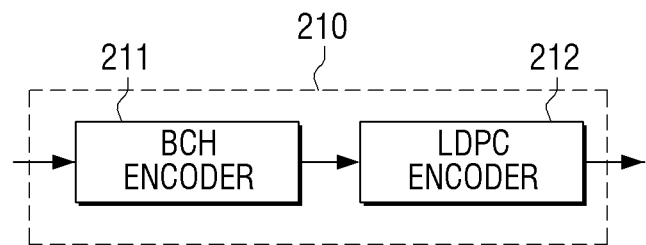

FIGS. 2A-2B illustrate block diagrams illustrating a configuration of a transmitter according to an exemplary embodiment. According to FIG. 2A, a transmitter 200 includes an encoder 210 and a puncturer 220.

The transmitter 200 may include entire or a part of components defined by the ATSC 3.0 standard, and particularly, the transmitter 200 may include a component to process the L1-post signaling defined by the ATSC 3.0 standard.

The encoder 210 performs Bose, Chaudhuri, Hocquenghem (BCH) encoding and LDPC encoding with respect to the L1-post signaling. For this, as shown in FIG. 2B, the encoder 210 may include a BCH encoder 211 for performing BCH encoding and a LDPC encoder 212 for performing LDPC encoding.

The BCH encoder 211 performs BCH encoding with respect to the L1-post signaling, and outputs a BCH codeword generated by the BCH encoding to the LDPC encoder 212. The LDPC encoder 212 may perform LDPC encoding with respect to the bits output from the BCH encoder 211 and may generate an LDPC codeword.

Herein, a BCH code and a LDPC code is a systematic code, and thus, the information word may be included in a codeword. In other words, BCH encoding is performed on the input L1-post signaling as information word bits, and thus, a BCH codeword generated as a result of the BCH encoding may include the L1-post signaling which is an information word as it is, and BCH parity bits added to the information word. Also, LDPC encoding is performed with the BCH codeword as information word bits, and thus, an LDPC codeword generated as a result of the LDPC encoding may include the L1-post signaling which is an information word as it is, and LDPC parity bits added to the information word.

Meanwhile, a BCH codeword and an LDPC codeword is generated by encoding, respectively, and thus, the BCH codeword is BCH coded bits or a BCH coded block, and the LDPC codeword is LDPC coded bits or a LDPC coded block.

The puncturer 220 punctures at least a part of the LDPC parity bits generated by the LDPC encoding.

Here, the number of bits punctured may be calculated on the basis of the number of bits available for transmitting an LDPC codeword and a modulation order of the L1-post signaling.

Hereinafter, a method of calculating the number of bits to be punctured is explained in detail.

As illustrated above, an L1-post signaling includes a parameter for accessing data at a receiver, and thus, a length of the L1-post signaling may be variable according to amounts of data. Accordingly, if the length of the L1-post signaling is longer than a certain value, the L1-post signaling is segmented in a certain length, and a plurality of the segmented L1-post signalings may be encoded, respectively. In this case, each of a plurality of LDPC codewords generated by encoding the plurality of segmented L1-post signalings is formed of the same number of bits, and thus, a method of calculating bits punctured from an LDPC codeword is explained below for a necessity of the explanation.

The puncturer 220 calculates the number of bits available for transmitting an LDPC codeword, and calculates the number of bits which are to be temporarily (or firstly) punctured from the LDPC parity bits so that the number of LDPC codeword bits after the temporary puncturing of LDPC parity bits can be the same as the number of the calculated number of bits available for transmitting the LDPC codeword.

To be specific, L1-post signaling is mapped onto a preamble in a frame along with L1-pre signaling, and is transmitted to the receiver. Accordingly, the L1-post signaling may be mapped onto a remaining cell after the L1-pre signaling is mapped onto the preamble. In this case, the L1-post signaling and the L1-pre signaling may be encoded and modulated, respectively, and then may be mapped onto a cell of the preamble (or, a sub-carrier) in a form of a cell (in other words, a coded modulation symbol).

Accordingly, the puncturer 220 may calculate the number of cells which remains after the L1-pre signaling is mapped onto cells of the preamble. Next, based on the number of cells which the L1-post signaling is able to be mapped onto, the puncture 220 calculate the number of L1-post signaling bits which is able to be mapped onto the calculated number of cells of the preamble symbol. Herein, the L1-post signaling is encoded and included in an LDPC codeword, and thus, the number of the L1-post signaling bits as calculated may be the number of bits available for transmitting the LDPC codeword.

Then, the puncturer 220 calculates the number of bits which are to be temporarily punctured from LDPC parity bits so that the LDPC codeword after the temporary puncturing has the calculated number of bits.

To be specific, the puncturer 220 calculates $N_{L1post\_available\_bits}$ which is the total number of bits available for transmission of the LDPC codeword using following Equation 1. In other words, the puncturer 220 calculates the number of bits available for transmission among the bits constituting one LDPC codeword.

$$N_{L1post\_Available\_bits} = \left\lfloor \frac{N_{Preamble\_Available\_Cells} - N_{L1pre}/\eta_{MOD\_L1pre}}{N_{L1post\_FECFRAME}} \right\rfloor \times \eta_{MOD\_L1post},$$  [Equation 1]

where $N_{preamble\_available\_cells}$ is the number of preamble cells available for transmitting an L1 signaling (that is, the amount of data of a preamble symbol), $N_{L1pre}$ is the number of L1-pre signaling bits, $\eta_{MOD\_L1pre}$ is a modulate order of an L1-pre signaling. Accordingly, in Equation 1, $N_{preamble\_available\_cells} - N_{L1pre}/\eta_{MOD\_L1pre}$ is the number of preamble cells available for transmitting an L1-post signaling, that is, the number of cells where the L1-post signaling is able to be mapped in a preamble symbol.

Also, $N_{L1post\_FECFRAME}$ is the number of LDPC codewords of the L1 post signaling. Here, since the L1-post signaling is segmented and then encoded, and forms a plurality of LDPC codewords as illustrated above, and thus, $N_{L1post\_FECFRAME}$ is the number of segmented L1-post signalings. Accordingly, a value $$\left\lfloor \frac{N_{Preamble\_Available\_Cells} - N_{L1pre}/\eta_{MOD\_L1pre}}{N_{L1post\_FECFRAME}} \right\rfloor$$

which is calculated by dividing the number of preamble cells required for transmitting the L1-post signaling by the number of LDPC codewords is the number of cells available for transmission of an LDPC codeword of the L1-post signaling. Accordingly, $N_{L1post\_FECFRAME}$ number of LDPC codewords may be mapped onto cells of the preamble symbol which is available for transmitting the L1-post signaling.

$\eta_{MOD\_L1post}$ is a modulation order of an L1-post signaling. Accordingly, by multiplying the number of preamble cells available for transmitting an LDPC codeword by a modulation order of an L1-post signaling, the total number of bits available for transmit an LDPC codeword of the L1-post signaling may be calculated. In other words, the number of bits needed to transmit an LDPC codeword of the L1-post signaling may be calculated.

The modulation order of an L1-pre signaling in Equation 1 means the number of bits constituting a modulated L1-pre signaling cell, and the modulation order of an L1-post signaling means the number of bits constituting a modulated L1-post signaling cell.

A modulation order has a same value as the number of bits constituting a modulation symbol, and thus, the modulation order may have a different value according to a modulation method. For example, if the modulation method is BPSK, QPSK, 16-QAM, 64-QAM, and 256-QAM, the modulation order is 1, 2, 4, 6, and 8, respectively. Accordingly, if the L1-pre signaling is modulated to the BPSK, $\eta_{MOD\_L1pre}$ becomes 1, and thus, $\eta_{MOD\_L1pre}$ may be omitted from Equation 1, and if L1-post signaling is modulated to the BPSK, $\eta_{MOD\_L1post}$ becomes 1, and thus, $\eta_{MOD\_L1post}$ may be omitted from Equation 1.

Also, in Equation 1, $\lfloor x \rfloor$ indicates the largest integer smaller than x, and as an example, $\lfloor 1.2 \rfloor = 1$.

Afterward, the puncturer 220 calculates the number of bits available for transmitting LDPC parity bits of the L1-post signaling on the basis of the number of bits available for transmitting an LDPC codeword of the L1-post signaling. In other words, the puncturer 220 may calculate the number of transmittable bits among the LDPC parity bits constituting one LDPC codeword of the L1-post signaling on the basis of the number of bits available for transmission of the LDPC codeword of the L1-post signaling.

To be specific, the puncturer 220 may calculate $N_{L1post\_available\_parity}$ which is the number of bits available for transmission of the LDPC parity bits of the L1-post signaling using following Equation 2.

$$N_{L1post\_Available\_parity} = N_{L1post\_Available\_bits} - K_{sig} - N_{bch\_parity}.$$  [Equation 2]

where $N_{L1post\_available\_bits}$ is the number of bits available for transmission of an LDPC codeword of an L1-post signaling, and $N_{bch\_parity}$ are the number of BCH parity bits of the L1-post signaling generated by BCH encoding. $K_{sig}$ is the number of L1-post signaling bits input to generate a codeword of the L1-post signaling.

Specifically, $K_{sig}$ is the number of L1-post signaling bits input to the encoder 210. If an L1-post signaling is segmented, and then, each of the segmented L1-post signalings is input to the encoder 210, $K_{sig}$ may be the number of the segmented L1-post signaling bits input to the encoder 210.

The encoder 210 performs BCH encoding and LDPC encoding in turn, and thus, information word bits of an LDPC codeword may be formed of information bits of and BCH parity bits output from the BCH encoding. In this case, the information bits of BCH encoding may be an L1-post signaling input to the encoder 210. Accordingly, as shown in Equation 2, the value of which the number of bits of the L1-post signaling bits input to the encoder 210 and the number of the BCH parity bits are subtracted from the number of bits available for transmitting the LDPC codeword may be the number of bits available for transmission of the LDPC parity bits of the L1-post signalling.

Herein, the number of bits available for transmission of the LDPC parity bits may be the same as or greater than the required number of the LDPC parity bits which may guarantee the minimum bit error rate (BER)/frame error rate (FER) performance. Here, the number of required parity bits may be determined according to one or more factors such as a channel environment.

Meanwhile, if the number of bits available for transmitting an LDPC codeword is smaller than a sum of the number of L1-post signaling bits and the number of BCH parity bits input to the encoder 210, that is, if $N_{L1post\_available\_bits} < K_{sig} + N_{bch\_parity}$, a preamble cell enough for transmitting an L1-post signaling does not exist, and thus, it is preferable that this case does not exist with respect to a system design.

Accordingly, the above-described Equation 2 may be expressed as Equation 3 below. In other words, as shown in Equation 3, the number of bits available for transmitting LDPC parity bits may be larger than 0.

$$N_{L1post\_Available\_parity} = \quad \text{[Equation 3]}$$
$$\max(0, (N_{L1post\_Available\_bits} - (K_{sig} + N_{bch\_parity}))),$$
where
$$\max(x, y) = \begin{cases} x, & \text{if } x >= y \\ y, & \text{if } y < x \end{cases}.$$

Next, the puncturer 220 may calculate the number of bits which are to be punctured from the LDPC parity bits so that the number of LDPC parity bits after the temporary puncturing is the same as the number of bits available for transmission of the LDPC parity bits. In other words, the puncturer 220 may calculate the number of bits which need to be temporarily punctured from the LDPC parity bits so that the number of LDPC parity bits constituting the LPDC codeword after the temporary puncturing is the same as the number of bits available for transmission of the LDPC parity bits.

To be specific, the puncturer 220 may calculate the number of bits $N_{punc\_temp}$ to be temporarily punctured from the LDPC parity bits using following Equation 4.

$$N_{punc\_temp} = \quad \text{[Equation 4]}$$
$$\max(0, N_{ldpc\_parity\_L1post} - N_{L1post\_Available\_parity}),$$
where
$$\max(x, y) = \begin{cases} x, & \text{if } x >= y \\ y, & \text{if } y < x \end{cases},$$

$N_{ldpc\_parity\_L1post}$ is the number of LDPC parity bits (that is, the number of LDPC parity bits generated by LDPC encoding), and $N_{L1post\_available\_parity}$ is the number of bits available for transmitting the LDPC parity bits.

In this case, if the number of LDPC parity bits is larger than the number of LDPC parity bits generated by transmittable LDPC encoding, all LDPC parity bits generated by the LDPC encoding may be transmitted to the receiver (not illustrated).

In other words, if an L1-post signaling is LDPC encoded by the encoding unit 210, LDPC parity bits with a certain length, that is, LDPC parity bits formed of $N_{ldpc\_parity\_L1post}$ number of bits are generated; however, in consideration of the number of preamble cells which the L1-post signaling is able to be mapped, the number of LDPC parity bits which are transmittable to the receiver (not illustrated) is limited to $N_{L1post\_available\_parity}$.

Accordingly, if the number of LDPC parity bits generated by the LDPC encoding is larger than the number of transmittable LDPC parity bits, the number of LDPC parity bits which is calculated by subtracting the transmittable number of LDPC parity bits from the number of LDPC parity bits generated by the LDPC encoding should be punctured. Accordingly, the puncturer 220 is able to calculate the number of bits to be temporarily punctured from the LDPC parity bits generated by the LDPC encoding by using Equation 4.

However, if the number of LDPC parity bits generated by the LDPC encoding is smaller than the number of transmittable LDPC parity bits, there exist extra preamble cells after the L1-post signaling is mapped onto. Accordingly, if the number of LDPC parity bits generated by the LDPC encoding is smaller than the number of transmittable LDPC parity bits, the transmitter 200 may not perform puncturing with respect to the LDPC parity bits or may additionally transmit a part of bits among LDPC codewords.

Meanwhile, a case where all LDPC parity bits generated as described above are transmitted to the receiver may occur. Accordingly, except this case, in other words, if only a case where a part of the LDPC parity bits must be punctured exists, Equation 4 above may be expressed as Equation 5 below.

$$N_{punc\_temp} = N_{ldpc\_parity\_L1post} - N_{L1post\_Available\_parity} \quad \text{[Equation 5]}$$

Meanwhile, in Equation 5, if the number of LDPC parity bits generated by the LDPC encoding is smaller than the number of transmittable LDPC parity bits (that is, if $N_{punc\_temp}$ is smaller than 0), the transmitter 200 may not perform puncturing with respect to the LDPC parity bits or may additionally transmit a part of bits among LDPC codewords.

Next, the puncturer 220 calculates the number of LDPC codeword bits after puncturing on the basis of the value which is calculated by subtracting the number of bits to be temporarily punctured from the number of LDPC codeword bits input to the puncturer 220, and calculates the number of bits punctured from LDPC parity bits on the basis of the number of LDPC codeword bits after the calculated puncturing.

Here, the number of LDPC codeword bits after puncturing may be the number of LDPC codeword bits remaining after the LDPC parity bits are temporarily punctured and the LDPC parity bits are additionally punctured. In this case, the additional puncturing may be performed if the number of LDPC codeword bits after temporarily puncturing the LDPC parity bits is not an integer multiple of a modulation order of the L1 post-signaling. Thus, after the additional puncturing, the number of the LDPC codeword bits may be an integer multiple of a modulation order of the L1-post signaling. Accordingly, if the number of LDPC codeword bits after temporarily puncturing the LDPC parity bits is an integer multiple of a modulation order of the L1 post-signaling, the number of bits additionally punctured may be zero (0).

To be specific, the puncturer 220 may calculate the number of LDPC codeword bits after puncturing using following Equation 6.

$$N_{L1post} = \left\lfloor \frac{N_{L1post\_temp}}{\eta_{MOD\_L1post}} \right\rfloor \times \eta_{MOD\_L1post}, \quad \text{[Equation 6]}$$

where $\eta_{MOD\_L1post}$ is the modulation order of the L1-post signaling. And, $N_{L1post\_temp}$ is the value of which the number of bits to be temporarily punctured is subtracted from the number of LDPC codeword bits. In other words, $N_{L1post\_temp}$ may be expressed as $N_{L1post\_temp} = K_{sig} + N_{bch\_parity} + N_{ldpc\_parity\_L1post} - N_{punc\_temp}$.

Accordingly, the number of LDPC codeword bits after puncturing may be an integer multiple of the modulation order of the L1-post signaling. The reason why the number of LDPC codeword bits after puncturing is set to be an integer multiple of the modulation order of the L1-post signaling is explained later.

Finally, the puncturer 220 may calculate the number of bits punctured from the LDPC parity bits using following Equation 7.

$$N_{punc}=N_{punc\_temp}+(N_{L1post\_temp}-N_{L1post}),\quad\text{[Equation 7]}$$

where $N_{punc\_temp}$ is the number of bits to be temporarily punctured, $N_{L1post}$ is the number of LDPC codeword bits after puncturing, and $N_{L1post\_temp}$ is the value which is calculated by subtracting the number of bits to be temporarily punctured from the number of LDPC codeword bits.

In other words, the puncturer 220 may calculate the number of bits which are to be finally punctured from the LDPC parity bits, generated by the LDPC encoding, by adding the number of bits to be temporarily punctured and the number of bits which are to be additionally punctured so that the number of LDPC codeword bits after the final puncturing of the LDPC parity bits can be an integer multiple of the modulation order of the L1-post signaling.

Also, the puncturer 220 may puncture the number of bits calculated using Equation 7 from the LDPC parity bits generated by the LDPC encoding. In this case, a location of bits punctured may be variable in the LDPC parity bits. For example, if the number of bits calculated using Equation 7 is 20, the puncturer 220 may puncture from the $1^{st}$ bit to the $20^{th}$ bit from LDPC parity bits, or may puncture from the $22^{nd}$ bit to the $30^{th}$ bit and from the $42^{nd}$ bit to the $52^{nd}$ bit.

As above, the puncturer 220 may calculate the number of bits to be punctured on the basis of the number of bits available for transmitting an LDPC codeword and a modulation order of an L1-post signaling, and may puncture the same number of LDPC parity bits as the calculated number of bits.

Meanwhile, the transmitter may transmit an LDPC codeword from which at least a part of LDPC parity bits is punctured to the receiver. For example, the transmitter 200 may map an LDPC codeword, from which at least a part of LDPC parity bits is punctured, onto an OFDM frame and transmit the mapped LDPC codeword to the receiver (not illustrated). Here, the LDPC codeword is generated by encoding an L1-post signaling, and thus, the LDPC codeword is mapped onto a preamble of the OFDM frame.

the puncturer 220 may make the number of LDPC codeword bits to be an integer multiple of a modulation order by inserting (or adding) zero bits instead of puncturing LDPC parity bits.

To be specific, if the number of transmittable LDPC parity bits is smaller than the number of LDPC parity bits generated by LDPC encoding, the puncturer 220 may calculate the number of LDPC codeword bits after the zero bits are inserted using following Equation 8.

$$N_{L1post}=\left\lfloor\frac{N_{L1post\_temp}}{\eta_{MOD\_L1post}}\right\rfloor\times\eta_{MOD\_L1post}\ c,\quad\text{[Equation 8]}$$

where $\eta_{MOD\_L1post}$ is a modulation order of an L1-post signaling. And, $N_{L1post\_temp}$ satisfies $N_{L1post\_temp}=K_{sig}+N_{bch\_parity}+N_{ldpc\_parity\_L1post}-N_{punc\_temp}$, and in this case, $N_{punc\_temp}=0$.

The puncturer 220 may calculate the number of zero bits to be inserted $N_{pad}$ using Equation 9 below, and the number of LDPC codeword bits may be an integer multiple of a modulation order by inserting the same number of zero bits as the calculated bits.

$$N_{pad}=N_{L1post}-N_{L1post\_temp}\quad\text{[Equation 9]}$$

where $N_{L1post}$ is the number of LDPC codeword bits after zero bits are inserted, and $N_{L1post\_temp}$ is the value which is calculated by subtracting the number of bits to be temporarily punctured from the number of LDPC codeword bits.

Accordingly, the puncturer 220 may make the number of LDPC codeword bits to be an integer multiple of a modulation order by inserting $N_{pad}$ number of zero bits to the LDPC codeword.

Meanwhile, a specific example of the number of parity bits to be punctured according to the above method may be described as Table 1 below. In Table 1, suppose that QPSK is used as a modulation method and segmentation of an L1-post signaling is not performed.

TABLE 1

| Ksig | Nbch | Nldpc | NL1post_bits | NL1post_par | Npunc_temp | NL1post_temp | Nl1post | Npunc |
|---|---|---|---|---|---|---|---|---|
| 100 | 168 | 8640 | 9480 | 9212 | 0 | 8908 | 8908 | 0 |
| 200 | 168 | 8640 | 9480 | 9112 | 0 | 9008 | 9008 | 0 |
| 300 | 168 | 8640 | 9480 | 9012 | 0 | 9108 | 9108 | 0 |
| 400 | 168 | 8640 | 9480 | 8912 | 0 | 9208 | 9208 | 0 |
| 500 | 168 | 8640 | 9480 | 8812 | 0 | 9308 | 9308 | 0 |
| 600 | 168 | 8640 | 9480 | 8712 | 0 | 9408 | 9408 | 0 |
| 700 | 168 | 8640 | 9480 | 8612 | 28 | 9480 | 9480 | 28 |
| 800 | 168 | 8640 | 9480 | 8512 | 128 | 9480 | 9480 | 128 |
| 900 | 168 | 8640 | 9480 | 8412 | 228 | 9480 | 9480 | 228 |
| 1000 | 168 | 8640 | 9480 | 8312 | 328 | 9480 | 9480 | 328 |
| 2000 | 168 | 8640 | 9480 | 7312 | 1328 | 9480 | 9480 | 1328 |
| 3000 | 168 | 8640 | 9480 | 6312 | 2328 | 9480 | 9480 | 2328 |
| 4000 | 168 | 8640 | 9480 | 5312 | 3328 | 9480 | 9480 | 3328 |
| 4343 | 168 | 8640 | 9480 | 4969 | 3671 | 9480 | 9480 | 3671 |

In this case, the LDPC codeword, from which at least a part of LDPC parity bits are punctured, may be interleaved demultiplexed to cells, modulated and mapped onto the OFDM frame.

According to the above exemplary embodiment, additional puncturing regarding LDPC parity bits is performed so that the number of LDPC codeword bits can be an integer multiple of a modulation order. However, this is merely one of examples. According to another exemplary embodiment, Hereinafter, the puncturing operation is explained in detail with reference to FIGS. 3 to 7. Meanwhile, parameters illustrated in FIGS. 3 to 7 may have the same meaning as illustrated in FIG. 2.

Figure 3:
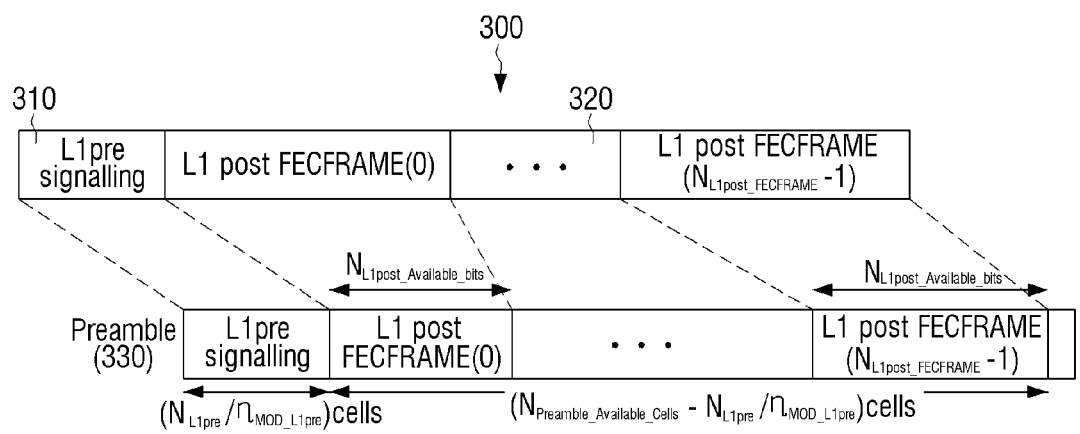
FIGS. 3 to 7 are views illustrating a puncturing operation, according to exemplary embodiments.

As illustrated in FIG. 3, an L1 signaling 300 may be formed of an L1-pre signaling 310 and an L1-post signaling 320. The L1-post signaling 320 may be formed of $N_{L1post\_FECFRAME}$ number of L1-post FEC frames (that is, LDPC codewords). In other words, the L1-post signaling 320 is segmented to have a certain length, and each of a plurality of segmented L1-post signaling is encoded, and thus, the L1-post signaling 3210 may be formed of $N_{L1post\_FECFRAME}$ number of L1-post FEC frames as illustrated in FIG. 3.

Meanwhile, the L1-pre signaling 310 and the L1-post signaling 320 may be mapped onto a preamble 330, respectively. In this case, the L1-post signaling and the L1-pre signaling may be modulated and then, mapped onto cells which constitute an OFDM preamble symbol, respectively.

In this case, as illustrated in FIG. 3, the L1-pre signaling 310 is mapped onto $N_{L1pre}/\eta_{MOD\_L1pre}$ number of cells, and thus, the L1-post signaling 320 should be mapped onto remaining cells of the OFDM preamble symbol after the L1-pre signaling 310 is mapped, among cells available for transmitting the L1 signaling. That is, the L1-post signaling 320 should be mapped onto $N_{preamble\_available\_cells} - N_{L1pre}/\eta_{MOD\_L1pre}$ number of cells.

Even if FIG. 3 illustrates the L1-pre signaling 310 and the L1-post signaling 320 being mapped onto the preamble 330 in a consecutive order, this is merely one of examples. The L1-pre signaling 310 and the L1-post signaling 320 may be mapped onto cells existing on various locations in the preamble 330 to be transmitted to the receiver.

As described above, the L1-post signaling 320 is formed of $N_{L1post\_FECFRAME}$ number of L1-post FEC frames, and thus, for all L1-post FEC frames to be mapped onto $N_{preamble\_available\_cells} - N_{L1pre}/\eta_{MOD\_L1pre}$ number of cells, each of the L1-post FEC frames should be formed of $N_{L1post\_available\_bits}$ number of bits.

At this time, the L1-post FEC frame includes an information word and LDPC parity bits, and the information word is formed of $(K_{sig} + N_{bch\_parity})$ bits, and thus, the number of LDPC parity bits should be smaller than, or the same as $N_{L1post\_available\_parity}$ so that an L1 post FEC frame may be formed of $N_{L1post\_available\_bits}$ number of bits. Accordingly, if the number of bits generated by the LDPC encoding exceeds $N_{L1post\_available\_parity}$, a part of the LDPC parity bits should be punctured.

Figure 4:
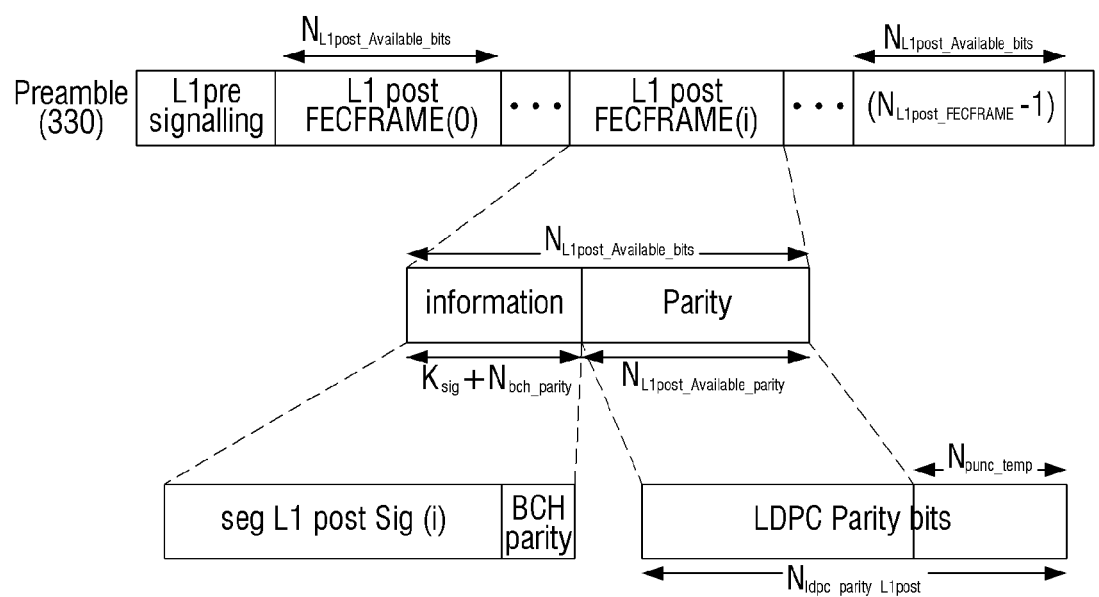
Figure 5:
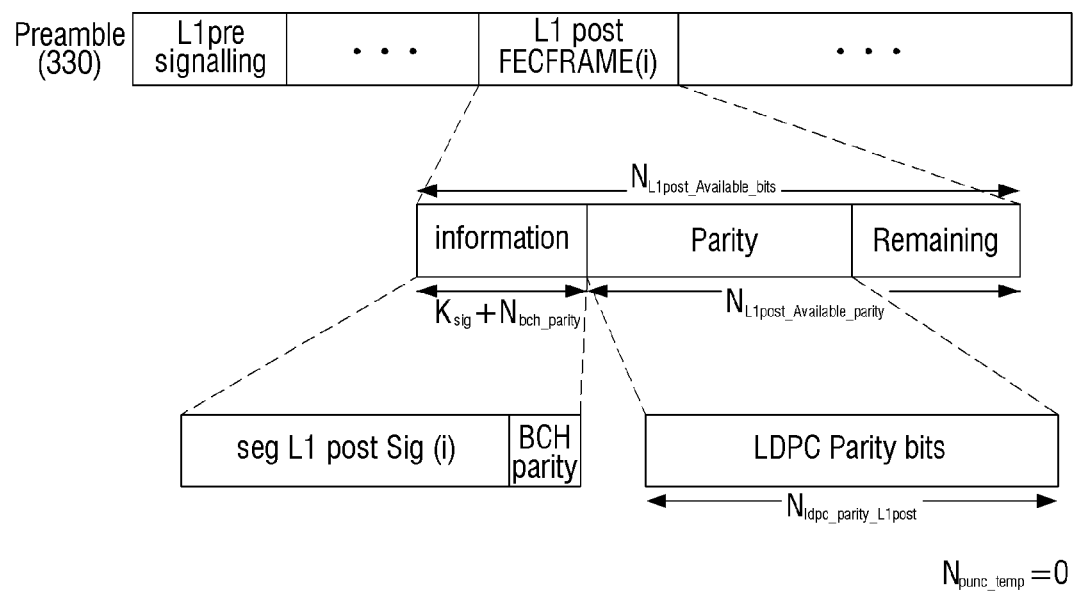

To be specific, as illustrated in FIG. 4, if the number of LDPC parity bits generated by the LDPC encoding is larger than $N_{L1post\_available\_parity}$, in other words, if $N_{ldpc\_parity\_L1post} \geq N_{L1post\_available\_parity}$, LDPC parity bits which correspond to the same number as $N_{punc\_temp}$ may be temporarily punctured. Meanwhile, as illustrated in FIG. 5, if the number of LDPC parity bits generated by the LDPC encoding is smaller than, or the same as $N_{L1post\_available\_parity}$, that is if $N_{ldpc\_parity\_L1post} \leq N_{L1post\_available\_parity}$, NDPC parity bits may not be temporarily punctured. In other words, the number of bits to be temporarily punctured may be zero (0). This is because, even if the LDPC parity bits are not punctured, all LDPC parity bits generated by the LDPC encoding may be mapped onto the preamble 330 to be transmitted to the receiver.

Accordingly, the number of LDPC parity bits after temporarily being punctured may be smaller than or the same as $N_{L1post\_available\_parity}$ number of bits.

Meanwhile, a part of the LDPC parity bits may be additionally punctured for the length of the L1-post FEC frame after temporarily puncturing the LDPC parity bits to be an integer multiple of a modulation order of the L1-post signaling.

Figure 6:
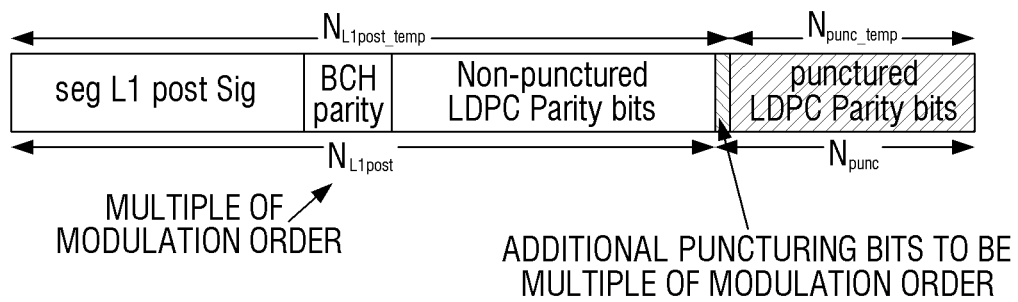

In other words, as illustrated in FIG. 6, if the length of the L1-post FEC frame $N_{L1post\_temp}$ after puncturing the LDPC parity bits of $N_{punc\_temp}$ is not an integer multiple of the modulation order of the L1-post signaling, the LDPC parity bits which correspond to the same number as $N_{L1post\_temp} - N_{L1post}$ may be additionally punctured. Here, $N_{L1post}$ may be the largest value below $N_{L1post\_temp}$ among the values which are integer multiples of the modulation order of the L1-post signaling. Accordingly, the number of LDPC parity bits to be punctured may be $N_{punc}$ as below: $N_{punc} = N_{punc\_temp} + (N_{L1post\_temp} - N_{L1post})$ In FIG. 6, a case where $N_{L1post\_temp} - N_{L1post}$ number of LDPC parity bits are additionally punctured from the L1-post FEC frame after $N_{punc\_temp}$ number of the LDPC bits are temporarily punctured is explained, but this is merely one of examples. Even in a case where the number of LDPC parity bits generated by the LDPC encoding is smaller than or the same as $N_{L1post\_available\_parity}$, the LDPC parity bits may be punctured so that the length of the L1 post FEC frame to be an integer multiple of a modulation order of an L1-post signaling.

Also, additionally puncturing the LDPC parity bits referring to FIG. 6 is merely one of examples.

In other words, if the number of LDPC parity bits generated by the LDPC encoding is smaller than or the same as $N_{L1post\_available\_parity}$, the number of bits of LDPC codeword may be an integer multiple of a modulation order of an L1-post signaling by adding zero bits.

Figure 7:
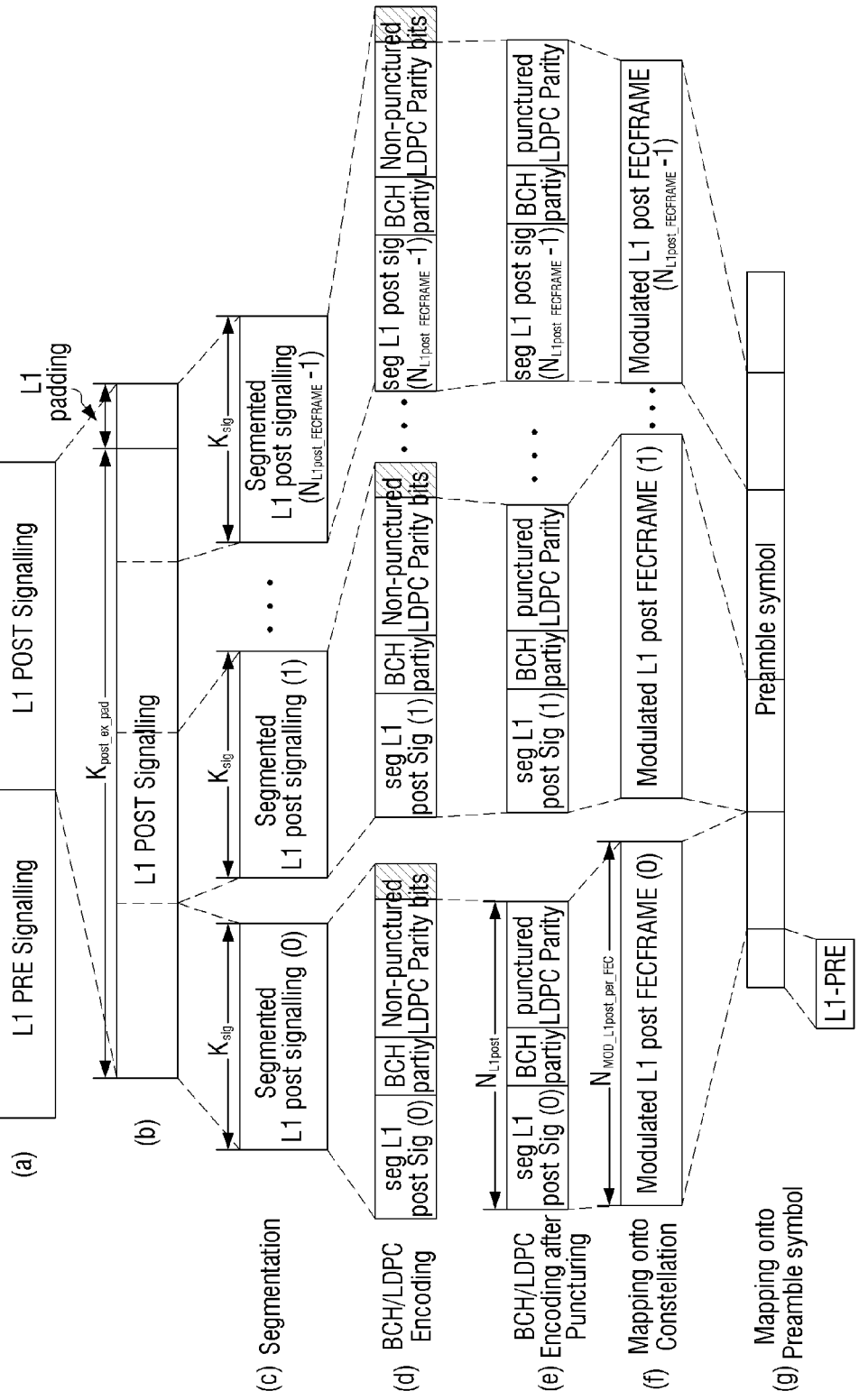

FIG. 7 illustrated a process in which an L1-post signaling is mapped onto a preamble, according to an exemplary embodiment.

As illustrated in FIG. 7(a), an L1 signaling includes an L1-pre signaling and an L1-post signaling. The L1-post signaling is formed of $K_{post\_ex\_pad}$ number of bits before $K_{L1\_PADDING}$ number of bits of an L1 padding are added as illustrated in FIG. 7(b). The L1 padding may be added to the L1 signaling so that each of the segmented L1-post signalings as described below has the same length.

The L1-post signaling may be segmented by a certain length. To be specific, as illustrated in FIG. 7(c), the L1-post signaling may be segmented into $N_{L1post\_FECFRAME}$ number of L1-post signalings, and each of the segmented L1-post signalings may be formed of $K_{sig}$ number of bits.

On each of the segmented L1-post signaling, a BCH encoding and an LDPC encoding may be performed, and accordingly, a plurality of LDPC codewords, that is, a plurality of L1-post FEC frames may be generated. In this case, as illustrated in FIG. 7(d), each of the LDPC codewords may be formed of information word bits and LDPC parity bits. Here, the information word bits of an LDPC codeword is formed of a segmented L1-post signaling and BCH parity bits.

A part of LDPC parity bits may be punctured. To be specific, as illustrated in FIG. 7(e), $N_{punc}$ number of LDPC parity bits may be punctured for the length of the punctured LDPC codeword to be $N_{L1post}$.

As illustrated in FIG. 7(f) and FIG. 7(g), the LDPC codeword in which a part of the LDPC parity bits is punctured may be modulated and mapped onto the preamble. Here, Meanwhile, the number of modulated L1-post signaling cells which are mapped onto the preamble, that is, the number of modulation symbols is as follows. To be specific, the number of the LDPC codeword bits after puncturing is $N_{L1post}$ as illustrated above, and a modulation order of the L1-post signaling is $\eta_{MOD\_L1post}$, and thus, the number of modulation symbols mapped onto the preamble corresponding to one LDPC codeword is $N_{MOD\_L1post\_per\_FEC} = N_{L1post}/\eta_{MOD\_L1post}$. Accordingly, the number of all modulation symbols mapped onto the preamble, $N_{MOD\_L1post\_total}$, is $N_{MOD\_L1post\_Total}=N_{MOD\_L1post\_per\_FEC} \times N_{L1post\_FECFRAME}$.

Figure 8:
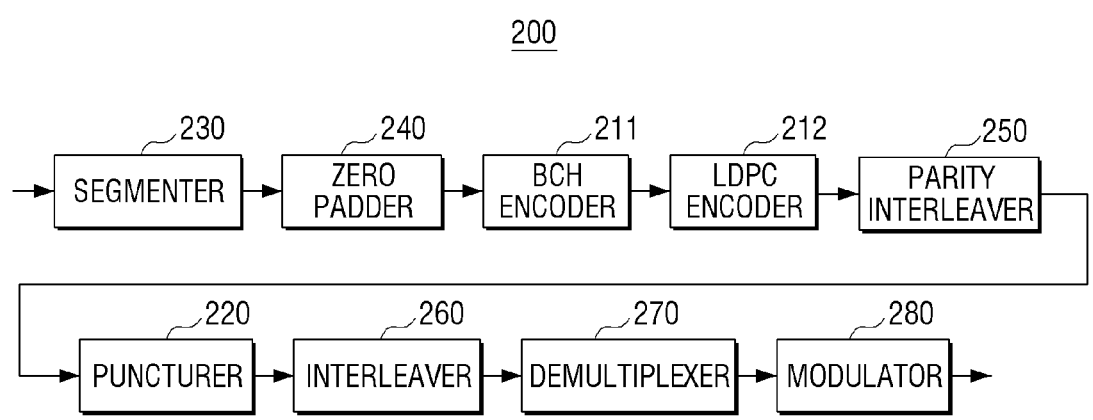
FIG. 8 is a block diagram illustrating a detailed configuration of a transmitter, according to an exemplary embodiment.

FIG. 8 is a block diagram illustrating a detailed configuration of a transmitter, according to an exemplary embodiment. According to FIG. 8, the transmitter 200 may further include a segmenter 230, a zero padder 240, a parity interleaver 250, an interleaver 260, a demultiplexer 270 and a modulator 280 in addition to the BCH encoder 211, the LDPC encoder 212, and the puncturer 220. Herein, the BCH encoder 211, the LDPC encoder 222 and the puncturer 220 are the same as those of FIG. 2B, and thus, a redundant explanation is omitted.

The segmenter 230 segments an L1-post signaling.

To be specific, if the length of the L1-post signaling is more than or the same as a certain value, the segmenter 230 may segment the L1-post signaling to have a certain length, and may output the plurality of segmented L1-post signalings to the zero padder 240.

In this case, the plurality of segmented L1-post signalings may form bit strings, respectively. However, if the segmentation does generate in the same length L1-post signalings, the segmenter 230 may add L1 padding bits to the L1-post signaling so that each of the plurality of segmented L1-post signalings can have a certain length, and may segment the L1-post signaling which the L1 padding bits are added.

Here, the certain length may be smaller than or the same as the number of bits possible to perform encoding at the encoder 210, that is, the BCH encoder 211 and the LDPC encoder 212. In other words, in a case of BCH encoding, an information word formed of a certain number of bits is needed for performing the BCH encoding, and thus, the segmenter 230 may segment the L1-post signaling such that each of the segmented L1-post signalings is formed of bits the number of which is smaller than or the same as the number of bits possible to perform encoding at the encoder 210.

Accordingly, the zero padder 240 adds (or pads) zero bits (or zero padding bits) to at least one of the segmented L1-post signalings, respectively.

The BCH encoder 211 generates a BCH codeword by BCH encoding and outputs the BCH codeword to the LDPC encoder 212, and the LDPC encoder 212 may perform LDPC encoding with respect to the BCH codeword as an information word. Since the LDPC encoding performed at the LDPC encoder 212 requires that the information word have a certain length according to a code rate, the BCH encoder 211 should generate a BCH codeword which has this length.

To generate a BCH codeword which has this length by the BCH encoder 211, the BCH encoding should be performed with respect to a certain number of bits. Accordingly, the zero padder 240 may add zero bits to at least one of the segmented L1-post signalings so that each of the segmented L1-post signalings can have this length of codeword bits required by the BCH encoding, and output the L1-post signaling to which the zero bits are added to the encoder 210.

For example, if a segmented L1 signaling is formed of $K_{sig}$ number of bits, and the number of information word bits for BCH encoding is $K_{bch}$, and $K_{bch} > K_{sig}$, the zero padder 240 may add $K_{bch} - K_{sig}$ number of zero bits to at least one of the segmented L1 signalings, respectively.

The encoder 210 may perform BCH encoding and LDPC encoding at the BCH encoder 211 and the LDPC encoder 212, respectively, with respect to the L1-post signaling output from the zero padder 240, and output a plurality of LDPC codewords to the parity interleaver 250.

In other words, the BCH encoder 211 may perform BCH encoding with respect to the L1-post signaling output from the zero padder 240, generate a plurality of BCH codewords, and output these codewords to the LDPC encoder 212.

A BCH codeword may be formed of a segmented L1 signaling, zero bits added to the segmented L1 signaling, and BCH parity bits. In other words, the number of BCH codeword bits, $N_{bch}$, may be $K_{sig}+(K_{bch}-K_{sig})+N_{bch\_parity}$, and this number may be the same as the number of information word bits of LDPC codes.

Here, $K_{sig}$ is the number of the segmented L1 signaling bits, $(K_{bch}-K_{sig})$ is the number of zero bits added to the segmented L1 signaling, and $N_{bch\_parity}$ is the number of BCH parity bits.

The LDPC encoder 212 performs LDPC encoding with respect to a BCH codeword output from the BCH encoder 211, and generates a plurality of LDPC codewords, and the LDPC codeword may be output to the parity interleaver 250.

A LDPC codeword may be formed of a segmented L1 signaling, zero bits added to the segmented L1 signaling, BCH parity bits, and LDPC parity bits. In other words, the number of LDPC codeword bits, $N_{ldpc}$, may be $K_{sig}+(K_{bch}-K_{sig})+N_{bch\_parity}+N_{ldpc\_parity\_L1post}$. Here, $N_{ldpc\_parity\_L1post}$ may be the number of LDPC parity bits.

The parity interleaver 250 may perform parity interleaving with respect to LDPC codewords conveyed from the encoder 210, respectively. The parity interleaver 250 performs interleaving with respect to the LDPC parity bits only among the bits constituting the LDPC codeword, and output the interleaved LDPC codewords to the puncturer 220.

The puncturer 220 may remove zero bits inserted by the zero padder 240 from each of the LDPC codewords, in which the zero bits are inserted, output from the parity interleaver 250.

To be specific, the puncturer 220 may remove zeros bit which are padded by the zero padder 240 among the bits output from the parity interleaver 250 based on a location and the number of zero bits inserted from the zero padder 240. An operation of removing zero bits after the zero bits are encoded is referred to as shortening, and the zero bits padded by the zero padder 240 are removed by the shortening, and is not transmitted to the receiver.

The puncturer 220 punctures a part of LDPC parity bits from each of the LDPC codewords output from the parity interleaver 250, and each of the LDPC codewords from which a part of the LDPC parity bits are punctured may be output to the interleaver 260.

In this case, the number of punctured LDPC bits is indicated by an equation $N_{punc}=N_{punc\_temp}+(N_{L1post\_temp}-N_{L1post})$. Here, $N_{punc\_temp}$ is the number of NDPC bits to be temporarily punctured, and $N_{L1post\_temp}$ is the number of LDPC codeword bits after puncturing and indicated by an equation $N_{L1post\_temp}=K_{sig}+N_{bch\_parity}+N_{ldpc\_parity\_L1post}-N_{punc\_temp}$. The number of LDPC bits to be punctured is explained above, and thus, duplicate descriptions are omitted.

As described above, the puncturer 220 may perform shortening and puncturing with respect to LDPC codewords, and output a result to the interleaver 260. For example, if the number of a segmented L1 signaling bits is $K_{sig}$, the number of BCH parity bits is $N_{bch\_parity}$, and the number of bits punctured is $N_{punc}$, the number of LDPC codeword bits output from the puncture 220, $N_{L1post}$, is $N_{L1post}=K_{sig}+N_{bch\_parity}+(N_{ldpc\_parity\_L1post}-N_{punc})$. Here, $N_{L1post}$ may be an integer multiple of a modulation order.

In the above example, the puncturer 220 may additionally puncture LDPC parity bits of $N_{L1post\_temp}-N_{L1post}$ so that $N_{L1post}$ becomes an integer multiple of the modulation order. However, this is merely one of examples, and the puncture 220 may insert zero bits instead of the additional puncturing so that the number of LDPC codeword bits may be an integer multiple of the modulation order.

In other words, the puncture 220 may insert $N_{pad\ number\ of}$ zeros bits to the LDPC codeword from which the LDPC parity bits are temporarily punctured, and thus, the number of LDPC codeword bits becomes an integer multiple of the modulation order. In this case, the number of LDPC codeword bits, $N_{L1post}$, output from the puncture 220 may be $N_{L1post} = K_{sig} + N_{bch\_parity} + (N_{ldpc\_parity\_L1post} - N_{punc\_temp} + N_{pad})$.

The interleaver 260 interleaves LDPC codewords output from the puncturer 220, respectively. In this case, the interleaver 260 interleaves the LDPC codewords using $N_c$ number of columns and $N_r$ number of rows, and output the interleaved LDPC codewords to the demultiplexer 270.

To be specific, the interleaver 260 may perform interleaving by writing LDPC codeword bits output from the puncturer 220 from the first column to the $N_c^{th}$ column in the direction of the column and by reading from the first row to the $N_r^{th}$ row of the plurality of columns in which the LDPC codeword bits are written. Accordingly, the bits written on the same row of each column are output sequentially, and an order of the LDPC codeword bits may be rearranged in comparison with the LDPC codeword bits before interleaving.

The interleaver 260 may perform interleaving optionally accordingly to a modulation method. For example, the interleaver 260 may perform interleaving on the LDPC codeword only where the modulation method is 16-QAM, 64-QAM or 256-QAM.

The number of columns and the number of rows of the interleaver 260 may be changed variously according to a code rate and a modulation method. If the code rate of LDPC code is 715, the number of columns $N_c$ is the same as a modulation order with respect to the L1-post signaling, and the number of rows $N_r$ may be a value which is calculated by dividing the number of LDPC codeword bits output from the puncturer 220 by $N_c$.

For example, the number of LDPC codeword bits output from the puncturer 220 is $N_{L1post}$, and thus, if the modulation method is 16-QAM, 64-QAM or 256-QAM, respectively, the number of columns $N_c$ becomes 4, 6 or 8, and the number of rows $N_r$ becomes $N_{L1post}/4$, $N_{L1post}/6$ or $N_{L1post}/8$.

As described above, the number of columns of the interleaver 260, $N_c$, is the same as the modulation order of the L1-post signaling, and the number of rows is $N_{L1post}/N_c$. Accordingly, if the number of LDPC codeword bits output from the puncturer 220 is an integer multiple of the modulation order of the L1-post signaling, bits constituting each LDPC codeword may be interleaved at once by the rows and columns of the interleaver 260. Thus, the transmitter 200 and a method of controlling the transmitter 200 may be configured such that the number of LDPC codeword bits after puncturing becomes an integer multiple of the modulation order of the L1-post signaling.

The demultiplexer 270 demultiplexes the LDPC codewords output from the interleaver 260, respectively.

The demultiplexer 270 performs bit-to-cell conversion with respect to each of the interleaved LDPC codewords, demultiplexes the interleaved LDPC codeword to cells each of which has a certain number of bits, and outputs the cells to the modulator 280.

For example, the demultiplexer 270 may output bits constituting an LDPC codeword output from the interleaver 260 to a plurality of sub-streams, respectively and sequentially, convert the LDPC codeword bits to a cell, and output the cell. In this case, bits having a same index in the plurality of sub-streams may constitute a same cell.

Herein, the number of sub-streams is the same as the number of bits which constitutes a cell. For example, if a modulation method is BPSK, QPSK, 16-QAM, 64-QAM and 256-QAM, the number of sub-streams becomes 1, 2, 4, 6, and 8, and the number of cells becomes $N_{L1post}$, $N_{L1post}/2$, $N_{L1post}/4$, $N_{L1post}/6$, $N_{L1post}/8$, respectively.

The demultiplexer 270 may perform demultiplexing optionally according to the modulation method. For example, the demultiplexer 270 may not perform demultiplexing if the modulation method is BPSK.

The modulator 280 may modulate cells output from the demultiplexer 270. To be specific, the modulator 280 may map the cells output from the demultiplexer 270 onto constellation points using various modulation methods such as BPSK, QPSK, 16-QAM, 64-QAM, 256-QAM, and the like, and thus, the cells are modulated.

The transmitter 200 may transmit a modulation symbol to the receiver (not illustrated). For example, the transmitter 200 may map the modulation symbol onto a frame, and may transmit the modulation symbol to the receiver through a channel allocated. In this case, a modulation symbol of L1-post signaling may be mapped onto a preamble in an OFDM frame.

In the above example, the zero padder 240 and the encoder 210 are described as additional elements, but this is merely one of examples, and the padder 240 may be included in the encoder 210. In other words, the encoder 210 may include the zero padder 240, the BCH encoder 211, and the LDPC encoder 212.

Figure 9:
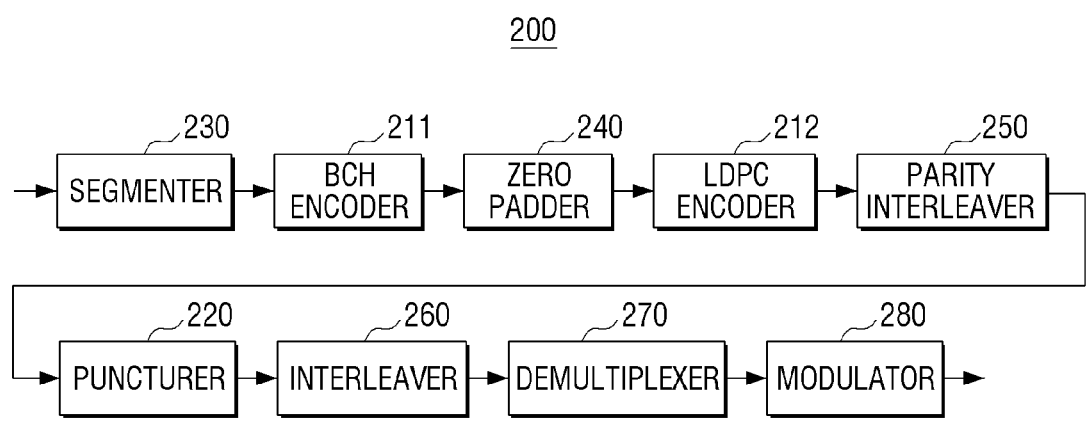
FIG. 9 is a block diagram illustrating a detailed configuration of a transmitter, according to an exemplary embodiment.

Also, in the above example, the zero padder 240 is arranged in front of the BCH encoder 211, but this is merely one of examples. As illustrated in FIG. 9, the zero padder 240 may be located between the BCH encoder 211 and the LDPC encoder 212. In this case, the operation performed by each component of the transmitter 200 in FIG. 9 is the same as that of each component of the transmitter 200 in FIG. 8, and only an arrangement of the components are merely different.

Referring to FIG. 9, the BCH encoder 211 performs BCH encoding with respect to the segmented L1-post signalings, respectively, a plurality of BCH codewords are generated, and the generated BCH codewords may be output to the zero padder 240.

The zero padder 240 may add zero bits to at least one BCH codeword, respectively, and output the plurality of BCH codewords, to which the zero bits are added, to the LDPC encoder 212. For example, if the length of a BCH codeword is $N_{bch}$ ($=K_{sig}+K_{bhc\_parity}$), and the length of an information word required for LDPC encoding is $K_{ldpc}$, the zero padder 240 may pad the $K_{ldpc}-N_{bch}$ number of zero bits to the BCH codeword.

The LDPC encoder 212 may perform LDPC encoding with respect to BCH codewords at least one of which includes the zero bits, generate a plurality of LDPC codewords, and output the LDPC codewords to the parity interleaver 250. In this case, each of the BCH codewords may be formed of $K_{ldpc}$ number of bits, and thus, the LDPC encoder 212 may perform LDPC encoding with respect to the BCH codeword to generate an LDPC codewords having a length of $N_{ldpc}$.

Also, even if it is not illustrated in FIGS. 8 and 9, the transmitter 200 may further include a scrambler (not illustrated). The scrambler may perform a function of randomizing and outputting bits input. The scrambler which performs this function may be arranged between the segmenter 230 and the zero padder 240 in FIG. 8, and may be arranged between the segmenter 230 and the BCH encoder 211.

The transmitter 200 according to another exemplary embodiment may further include a controller (not illustrated) to control an overall operation of the transmitter 200.

To be specific, the controller may calculate various parameters to control an operation performed at each component of the transmitter 200, and may provide the various parameters to each component. Accordingly, each of the encoder 210, the puncturer 220, the segmenter 230, the zero padder 240, the parity interleaver 250, the interleaver 260, the demultiplexer 270 and the modulator 280 may perform an operation using the information transmitted from the controller.

For example, the controller may calculate a segmentation length of an L1-post signaling and provide the information to the segmenter 210, and provide information regarding zero bits added to at least one segmented L1-post signaling to the zero padder 240. Also, the controller may provide information regarding a code rate, a length of a codeword, and the like to the encoder 220, and provide information regarding a parity interleaving method to the parity interleaver 250. Also, the controller may calculate the number of bits punctured and provide the information to the puncture 220, and provide the information regarding the interleaving method to the interleaver 260. Also, the controller may provide information regarding a demultiplexing method to the demultiplexer 270, and provide information regarding a modulation method to the modulator 280.

Figure 10A:
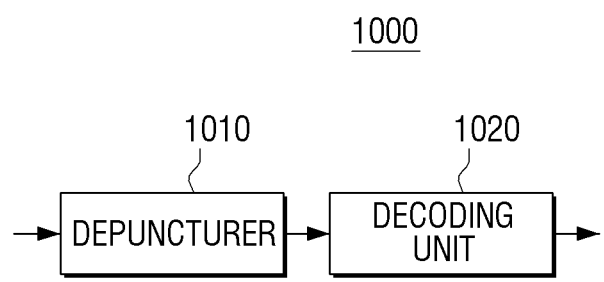
FIGS. 10A and 10B are block diagrams illustrating a configuration of a receiver, according to an exemplary embodiment.
Figure 10B:
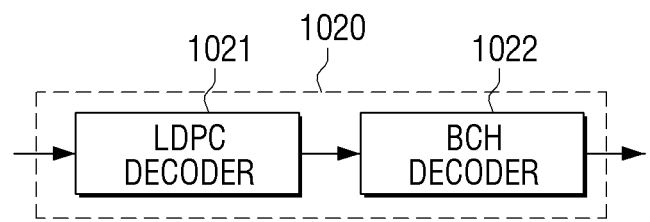

FIGS. 10A and 10B are block diagrams illustrating a configuration of a receiver according to an exemplary embodiment. According to FIG. 10A, the receiver 1000 includes a depuncturer 1010 and a decoding unit 1020.

The depuncturer 1010 may perform depuncturing with respect to a channel value of a signal received from the transmitter 200. Here, the channel value of the received signal may be various, and for example, the channel value may be Log Likelihood Ratio (LLR) value.

The depuncturer 1010 is a component corresponding to the puncturer 220 of the transmitter 200 shown in FIG. 2A, and performs an operation corresponding to the puncturer 220 of the transmitter 200. In other words, the depuncturer 1010 inserts, in the received channel value, an LLR value corresponding to LDPC parity bits punctured at the puncturer 220, and outputs the depunctured value to the decoding unit 1020. The LLR value corresponding to the bits punctured may be zero (0).

In this case, information regarding the location and the number of bits punctured at the puncturer 200 may be provided from the transmitter 200 or pre-stored in the receiver 1000. Herein, the number of bits punctured at the puncturer 220 may be the same as $N_{punc}=N_{punc\_temp}+(N_{L1post\_temp}-N_{L1post})$.

The decoding unit 1020 may perform decoding using an output value of the depuncturer 1010. The decoding unit 1020 is a component corresponding to the encoder 210 of the transmitter 200, and performs an operation corresponding to that of the encoder 210. For this, as illustrated in FIG. 10B, the decoding unit 1020 may include an LDPC decoder 1021, and a BCH decoder 1022.

The LDPC decoder 1021 is a component corresponding to the LDPC encoder 212, and performs an operation corresponding to the LDPC encoder 212. For example, the LDPC decoder 1021 may perform LDPC decoding with respect to the LLR value output from the depuncturer 1010 on the basis of an iterative decoding method based on a sum-product algorithm to correct an error.

The sum-product algorithm converts messages (for example, the value of LLR) through an edge on a bipartite graph of a message passing algorithm, calculates an output message from the messages input to variable nodes or check nodes, and updates.

The BCH decoder performs BCH decoding with respect to an output value of the LDPC decoder 1021.

The output value of the LDPC decoder 1021 includes an L1-post signaling and BCH parity bits, and thus, the BCH decoder 1022 may correct an error using the BCH parity bits, and output an L1-post signaling from which the error is corrected.

LDPC decoding and BCH decoding may be performed by various known methods.

For the LDPC decoding and BCH decoding, information regarding an encoding method, a code rate and the like performed at the transmitter 200 may be provided from the transmitter 200 or pre-stored in the receiver 1000.

Figure 11:
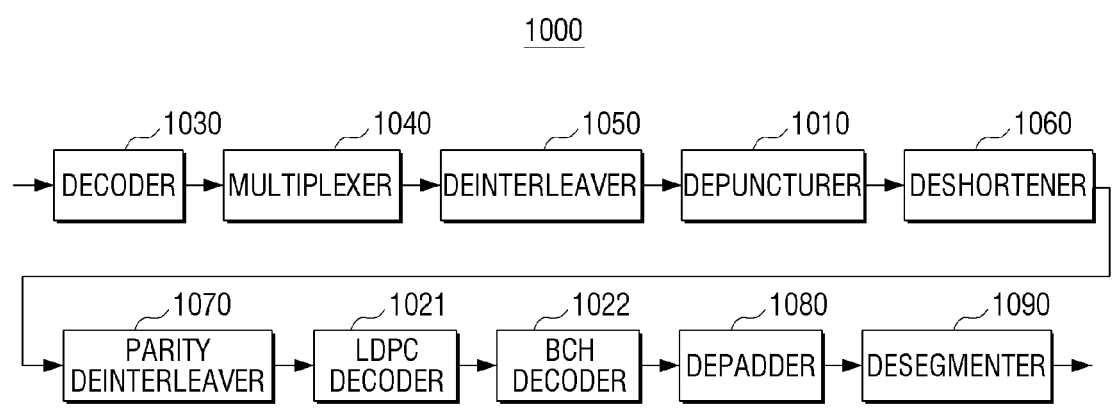
FIG. 11 is a block diagram illustrating a detailed configuration of a receiver, according to an exemplary embodiment.

FIG. 11 is a block diagram which illustrates a detailed configuration of the receiver 1000 according to an exemplary embodiment. According to FIG. 11, the receiver 1000 may further include a decoder 1030, a multiplexer 1040, a deinterleaver 1050, a deshortener 1060, a parity deinterleaver 1070, a depadder 1080 and a desegmenter 1090 in addition to the depuncturer 1010, the LDPC decoder 1021 and the BCH decoder 1022.

Herein, the decoder 1030 receives and decodes a signal which the transmitter 200 transmitted. The decoder 1030 may decode the received signal, generate a value corresponding to the LDPC codeword, and output the value to the multiplexer 1040.

Herein, the value corresponding to the LDPC codeword may be expressed as a channel value. A method of determining the channel value may be various, and one of examples may be a method of determining an LLR value.

The LLR value may be expressed as a value where log is taken to a ratio of a probability that a bit transmitted from the transmitter 200 is 0 to a probability that the bit transmitted from the transmitter 200 is 1. Otherwise, the LLR value may be a bit value itself determined according to a hard decision, or a representative value determined according to a section where a probability that a bit transmitted from the transmitter is 0 or 1.

The multiplexer 1040 may multiplex an output value of the decoder 1030, and output to the deinterleaver 1050.

To be specific, the multiplexer 1040 is a component corresponding to the demultiplexer 270 of the transmitter 200, and may perform an operation corresponding to that of the demultiplexer 270. In other words, the multiplexer 1040 may perform a cell-to-bit conversion with respect to an output value of the decoder 1030, and rearrange the LLR value in a bit unit.

The deinterleaver 1050 may deinterleave an output value of the multiplexer 1040, and output the deinterleaved value to the depuncturer 1010.

The deinterleaver 1050 is a component corresponding to an interleaver 260 of the transmitter 200, and may perform an operation corresponding to that of the interleaver 260. In other words, the deinterleaver 1050 may perform an interleaving operation inversely to deinterleave an input value.

The depuncturer 1010 adds a certain value to the deinterleaved value from the deinterleaver 1050, and outputs a value including the certain value to the deshortener 1060.

The depuncturer 1010 is a component corresponding to the puncturer 220 of the transmitter 200, and performs an operation corresponding to that of the puncturer 220.

To be specific, the depuncturer 1010 may insert an LLR value, corresponding to bits punctured at the puncturer 220, in the deinterleaved value. Here, the LLR value of the bits punctured may be zero (0). For this depuncturing operation, the receiver 1000 may pre-store information regarding the number of bits punctured at the transmitter 200 or a location, or the information may be provided from the transmitter 200. Here, the number of bits punctured at the puncturer 220 may be $N_{punc}=N_{punc\_temp}+(N_{L1post\_temp}-N_{L1post})$. Accordingly, the depuncturer 1010 may insert the corresponding number of LLR values to a location where the punctured LDPC parity bits existed.

The deshortener 1060 may perform deshortening to add a certain value to an output value of the depuncturer 1010, and output the deshortened value to the parity deinterleaver 1070. The deshortener 1060 is a component corresponding to the puncturer 220 or a zero padder 240 of the transmitter 200, and may perform an operation corresponding to that of the puncturer 220 and the zero padder 240.

To be specific, the deshortener may add LLR values corresponding to zero bits which were removed from the puncturer 220 after being added in the zero padder 1240. Here, the LLR values corresponding to the removed zero bits may be $+\infty$ or $-\infty$. For this deshortening operation, the receiver 1000 may pre-store information regarding the number of zero bits removed at the transmitter 200, a location and a bit value, or the information may be provided from the transmitter. Accordingly, the deshortener 1060 may insert the corresponding number of LLR values to the location where the removed zero bits existed.

The depuncturer 1010 and the deshortener 1060 are illustrated in the order of the depuncturer 1010 and the deshortener 1060 as illustrated in FIG. 11, but this is merely one of examples, and the order of the depuncturer 1010 and the deshortener 1060 may be changed.

The parity deinterleaver 1070 may perform parity deinterleaving with respect to an output value of the deshortener 1060, and output the deshortened value to the decoding unit 1020.

The parity deinterleaver 1070 is a component corresponding to the parity interleaver 250 of the transmitter 200, and performs an operation corresponding to that of the parity interleaver 250. In other words, the parity deinterleaver 1070 may perform an interleaving operation performed at the parity interleaver 250 inversely, and deinterleave LLR values corresponding to LDPC parity bits among the LLR values output from the deshortner 1060.

However, the parity interleaver 1070 may be omitted according to whether the parity interleaver 250 is used at the transmitter 200.

The decoding unit 1020 performs decoding using an output value of the parity deinterleaver 1070. For this decoding operation, the decoding unit 102 includes the LDPC decoder 1021 and the BCH decoder 1022 to perform LDPC decoding and BCH decoding, respectively, using the LLR values output from the parity deinterleaver 1070, and outputs an L1-post signaling generated as a decoding result to the depadder 1080.

To be specific, the LDPC decoder 1021 performs the LDPC decoding based on an output value of the parity deinterleaver 1070, and outputs a value of the decoding result to the BCH decoder 1022. The BCH decoder 1022 performs the BCH decoding with respect to the output value of the decoder 1021, and outputs a value of the decoding result to the depadder 1080.

Here, the output value of the LDPC decoder 1021 is formed of a plurality of bit strings each including a segmented L1-post signaling, zero bits added to the segmented L1-post signaling and BCH parity bits, respectively. Thus, the BCH decoder 1022 may correct an error using the BCH parity bits, and output a plurality of bit strings each including the segmented L1-post signaling and zero bits added to the segmented L1-post signaling to the depadder 1080.

The depadder 1080 may remove zero bits from an output value of the decoding unit 1020, and output the value, from which the zero bits are removed, to the desegmenter 1090.

The depadder 1080 is a component corresponding to the zero padder 240 of the transmitter 200, and may perform an operation corresponding to that of the zero padder 240. In other words, the depadder 1080 may remove zero bits added at the zero padder 240 from each bit string output from the BCH decoder 1022, and output a plurality of segmented L1-post signalings. For this depadding operation, the information regarding a location and the number of zero bits added by the zero padder 240 may be provided from the transmitter 200, or pre-stored in the receiver 1000.

Accordingly, the desegmenter (or a combiner) 1090 may perform desegmenting with respect to an output value of the depadder 1080.

To be specific, the desegmenter 1090 is a component corresponding to the segmenter of the transmitter 200, and an operation corresponding to that of the segmenter 230 may be performed. In other words, the plurality of bit strings output from the depadder 1080, that is, the plurality of segmented L1-post signalings are segmented by the transmitter 200, and thus, the desegmenter 1080 may desegment the plurality of segmented L1-post signaling to generate and output the L1-post signaling before being segmented.

Meanwhile, information required for an operation of each component of the receiver 1000 may be provided from the transmitter 200, or pre-stored in the receiver 1000. Here, the information required for the operation of each component of the receiver 1000 may be a multiplexing method performed at the multiplexer 1040, a deinterleaving method performed at the deinterleaver 1050, a location and the number of LLR values added at the depuncturer 1010 and the deshortener 1060, and a deinterleaving method performed at the parity deinterleaver 1070, an order of desegmenting the segmented L1-post signaling at the desegmenter 1080 and the like. The number of bits to be punctured may be calculated by the method described above.

If the transmitter 200 processes an L1-post signaling using the components illustrated in FIG. 8, the receiver 1000 may process the L1-post signaling using the components illustrated in FIG. 11.

Figure 12:
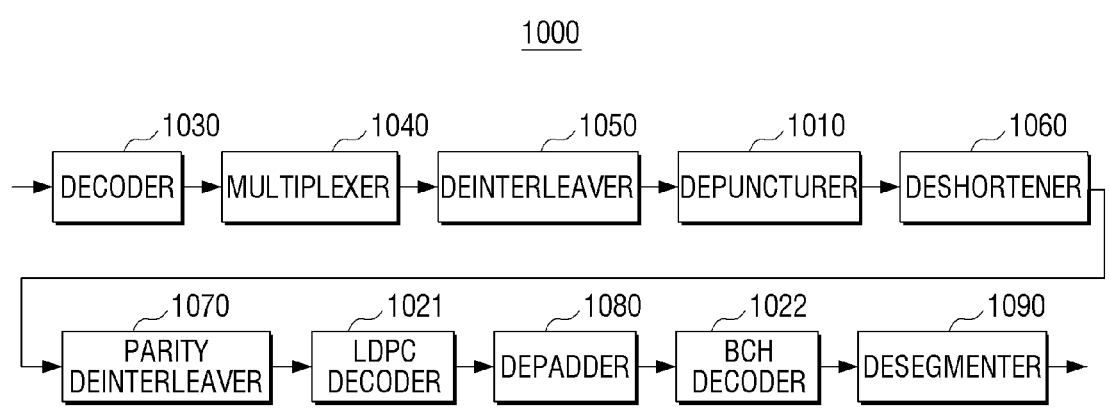
FIG. 12 is a block diagram illustrating a detailed configuration of a receiver according to an exemplary embodiment.

If the transmitter 200 uses the components illustrated in FIG. 9, the receiver 1000 may process the L1-post signaling using the components illustrated in FIG. 12. The transmitters in FIGS. 11 and 12 are merely different in arrangement of the components perform the same operation. Accordingly, the above difference is explained below.

The LDPC decoder 1021 may output bits generated as a result of decoding to the depadder 1080. In this case, the bits input to the depadder 1080 may be formed of a segmented L1-post signaling, zero bits padded in the segmented L1-post signaling and BCH parity bits.

The depadder 1080 may remove zero bits from bits output from the LDPC decoder 1021, and output the BCH decoder 1022.

Accordingly, bits input to the BCH decoder 1022 are formed of the segmented L1-post signaling and BCH parity bits, and thus, the BCH decoder 1636 may correct an error using the BCH parity bits, and output the segmented L1 post-signaling to the desegmenter 1090.

If a scrambler is used at the transmitter 200, even though it is not illustrated in FIGS. 11 to 12, the receiver 1000 may further include a descrambler (not illustrated). The descrambler may perform a function of derandomizing (inversely randomizing) input bits and output derandomized bits. The descrambler which performs this function may be arranged between the depadder 1080 and desegmenter 1090 as illustrated in FIG. 11, and be arranged between the BCH decoder 1022 and the desegmenter 1090 as illustrated in FIG. 12.

In the above exemplary embodiment, the L1-post signaling is segmented and transmitted to the receiver 100, but this is merely one of examples. If the L1-post signaling has a length equal to or less than a certain value, the L1-post signaling is not segmented to be transmitted to the receiver 1000. In this case, a bit string input to the desegmenter 1090 may be formed of an L1-post signaling, and thus, the desegmenter 1090 may output the L1-post signaling without desegmentation.

Figure 13:
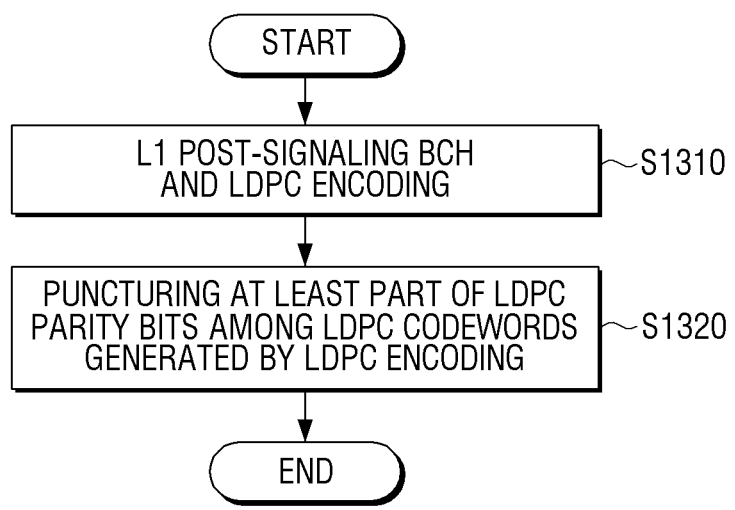
FIG. 13 is a view illustrating a puncturing method of a transmitter, according to an exemplary embodiment.

FIG. 13 is a flowchart illustrating a puncturing method of a transmitter according to an exemplary embodiment.

First of all, BCH encoding and LDPC encoding are performed with respect to an L1-post signaling (S1310).

Then, a part of LDPC parity bits among an LDPC codeword generated by the LDPC encoding is punctured (S1320). The number of bits to be punctured is calculated on the basis of the number of bits available for transmission of the LDPC codeword and a modulation order of the L1-post signaling.

To be specific, the number of bits available for transmission of the LDPC codeword is calculated in S1320, and the number of bits to be temporarily punctured from LDPC parity bits is calculated. Here, the temporary puncturing is performed so that the number of the LDPC codeword bits after the temporary puncturing of the LDPC parity bits is the same as the calculated number of bits available for transmission of the LDPC codeword.

The number of bits available for transmission of LDPC parity bits may be calculated based on the number of bits available for transmission of LDPC codeword in S1320. Here, the number of bits available for transmission of the LDPC parity bits may be calculated using Equation 2 above. Equation 2 above may be expressed as Equation 3.

The number of bits to be temporarily punctured may be calculated. Here the temporary puncturing is performed so that the number of LDPC parity bits after the temporary puncturing is the same as the number of bits available for transmission of LDPC parity bits in S1320. Here, the number of bits temporarily punctured from the LDPC parity bits may be calculated using Equation 4 above. Equation 4 above may be expressed as Equation 5.

The number of LDPC codeword bits after puncturing is calculated based on a value which is calculated by subtracting the number of bits to be temporarily punctured from the LDPC codeword bits, and the number of bits to be punctured from the LDPC parity bits may be calculated based on the number of LDPC codeword bits after the calculated puncturing.

Here, the number of LDPC codeword bits after puncturing may be calculated using Equation 6. The number of bits punctured among the LDPC parity bits may be calculated using Equation 7 above.

Figure 14:
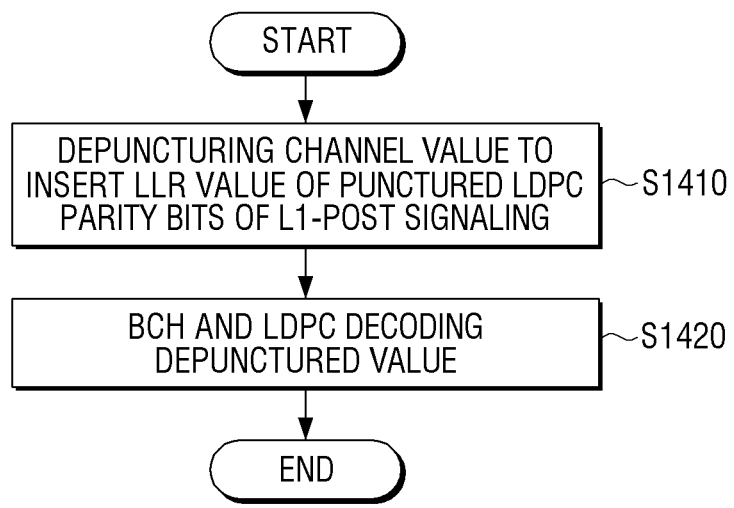
FIG. 14 is a view illustrating a depuncturing method of a receiver, according to an exemplary embodiment

FIG. 14 is a flowchart to illustrate a depuncturing method of a receiver, according to an exemplary embodiment.

First, depuncturing with respect to a channel value of a signal received from a transmitter is performed at the depuncturer 1010 of FIG. 10A (S1410). Here, the channel value of the received signal may be an LLR value. The depuncturing may be performed by inserting, in the received channel value, an LLR value corresponding to LDPC parity bits punctured at the puncturer 220, and outputs the depunctured value to the decoding unit 1020 of FIG. 10A. The LLR value corresponding to the bits punctured may be zero (0).

Next, decoding is performed on the depunctured value output from the depuncturer 1010 (S1420). The decoding operation may include LDPC decoding and BCH decoding.

The above described depuncturing and decoding operation are the same as described above in reference to FIGS. 10A-12, and thus, detailed description thereof are omitted here.

A non-transitory computer readable medium which stores a program of performing signal processing methods including puncturing and depuncturing operations may be provided, according to an exemplary embodiment.

The non-transitory readable medium means a medium which stores a data semi-permanently and is readable by an apparatus, not a media which stores a data for a short period such as a register, a cache, a memory and so on. Specifically, various applications or programs may be stored and provided in a non-transitory readable medium such as a compact disc (CD), a digital versatile disc (DVD), a hard disk, a Blu-ray disk, a universal serial bus (USB), a memory card and read-only memory (ROM).

The components represented by blocks as illustrated in FIGS. 2A-12 may be embodied as various numbers of hardware, software and/or firmware structures that execute respective functions described above, according to an exemplary embodiment. For example, these components may use a direct circuit structure, such as a memory, processing, logic, a look-up table, etc. that may execute the respective functions through controls of one or more microprocessors or other control apparatuses. Also, these components may be specifically embodied by a program or a part of code, which contains one or more executable instructions for performing specified logic functions. Also, at least one of these components may further include a processor such as a central processing unit (CPU) that performs the respective functions, a microprocessor, or the like. Although a bus is not illustrated in the above block diagrams of FIGS. 2A-12, communication between the respective blocks may be performed via the bus.

Various exemplary embodiments have been illustrated and explained above, but the inventive concept is not limited to these exemplary embodiments. These embodiments are intended to be illustrative, and not to limit the scope of the claims, and it would be appreciated by those skilled in the art that changes may be made to these embodiments without departing from the principles and spirit of the inventive concept, the scope of which is defined in the appended claims.

What is claimed is:

1. A transmitter for processing a signaling comprising a first-type signaling and a second-type signaling, the transmitter comprising:
   an encoder configured to encode the first-type signaling using a Bose, Chaudhuri, Hocquenghem (BCH) code and a Low Density Parity Check (LDPC) code to generate BCH parity bits and LDPC parity bits;

a puncturing unit configured to puncture at least a part of the LDPC parity bits among an LDPC codeword comprising the first-type signaling, the BCH parity bits and the LDPC parity bits; and a transmitting unit configured to interleave, modulate and transmit the LDPC codeword output from the puncturing unit, wherein a number of bits to be punctured by the puncturing unit is calculated based on a number of bits available for transmission of the LDPC codeword and a modulation order of the first-type signaling, and wherein the number of bits available for transmission of the LDPC codeword is calculated based on a number of cells to which the first-type signaling and the second-type signaling are mapped, a number of bits of the second-type signaling and a modulation order of the second-type signaling.

2. The transmitter of claim 1, wherein the puncturing unit calculates the number of bits available for transmission of the LDPC codeword, and calculates a number of bits which are to be temporarily punctured from the LDPC parity bits so that a number of LDPC codeword bits after the temporary puncturing of the LDPC parity bits is the same as the calculated number of bits available for transmission of the LDPC codeword.

3. The transmitter of claim 2, wherein the puncturing unit calculates the number of bits available for transmission of the LDPC codeword, $N_{L1post\_available\_bits}$, using a following equation:

$$N_{L1post\_Available\_bits} = \left\lfloor \frac{N_{Preamble\_Available\_Cells} - N_{L1pre}/\eta_{MOD\_L1pre}}{N_{L1post\_FECFRAME}} \right\rfloor \times \eta_{MOD\_L1post},$$

where $N_{preamble\_available\_cells}$ is a number of preamble cells available for transmitting the signaling, $N_{L1pre}$ is a number of bits of the second-type signaling, $\eta_{MOD\_L1pre}$ is a modulation order of the second-type signaling, $N_{L1post\_FECFRAME}$ is a number of LDPC codewords of the first-type signaling, and $\eta_{MOD\_L1post}$ is a modulation order of the first-type signaling.

4. The transmitter of claim 2, wherein the puncturing unit calculates the number of bits available for transmission of the LDPC parity bits based on the number of bits available for transmission of the LDPC codeword.

5. The transmitter of claim 4, wherein the puncturing unit calculates the number of bits available for transmission of the LDPC parity bits using a following equation:

$$N_{L1post\_Available\_parity} = N_{L1post\_Available\_bits} - K_{sig} - N_{bch\_parity},$$

where $N_{L1post\_available\_bits}$ is the number of bits available for transmission of the LDPC codeword, $K_{sig}$ is a number of bits of the signaling input to the encoder, and $N_{bch\_parity}$ is a number of the BCH parity bits generated by the encoding.

6. The transmitter of claim 4, wherein the puncturing unit calculates the number of bits which are to be temporarily punctured from the LDPC parity bits so that a number of the LDPC parity bits after the temporary puncturing is the same as the number of the bits available for transmission of the LDPC parity bits.

7. The transmitter of claim 6, wherein the puncturing unit calculates the number of bits to be temporarily punctured from the LDPC parity bits, $N_{punc\_temp}$, using a following equation:

$$N_{punc\_temp} = N_{ldpc\_parity\_L1post} - N_{L1post\_Available\_parity},$$

where $N_{ldpc\_parity\_L1post}$ is a number of the LDPC parity bits before the temporary puncturing, and $N_{L1post\_available\_parity}$ is the number of bits available for transmission of the LDPC parity bits.

8. The transmitter of claim 2, wherein the puncturing unit calculates a number of the LDPC codeword bits after puncturing based on a value which is calculated by subtracting the number of the LDPC parity bits to be temporarily punctured from the number of the LDPC codeword bits, wherein the number of the LDPC codeword bits after puncturing is a number of the LDPC codeword bits which remain after the temporary puncturing and one of additional puncturing of the LDPC parity bits or adding bits having a predetermined value to the LDPC codeword bits which remain after the temporary puncturing.

9. The transmitter of claim 8, wherein the puncturing unit calculates the number of the LDPC codeword bits after the puncturing, $N_{L1post}$, using a following equation:

$$N_{L1post} = \left\lfloor \frac{N_{L1post\_temp}}{\eta_{MOD\_L1post}} \right\rfloor \times \eta_{MOD\_L1post},$$

where $N_{L1post\_temp}$ is a value which is calculated by subtracting the number of bits to be temporarily punctured from the number of the LDPC codeword bits, and $\eta_{MOD\_L1post}$ is the modulation order of the first-type signaling.

10. The transmitter of claim 8, wherein the puncturing unit calculates a number of bits punctured from the LDPC parity bits using a following equation:

$$N_{punc} = N_{punc\_temp} + (N_{L1post\_temp} - N_{L1post}),$$

where $N_{punc\_temp}$ is the number of bits temporarily punctured, $N_{L1post}$ is the number of the LDPC codeword bits after puncturing, $N_{L1post\_temp}$ is a value which is calculated by subtracting the number of bits to be temporarily punctured from the number of the LDPC codeword bits.

11. A puncturing method of a transmitter for processing a signaling comprising a first-type signaling and a second-type signaling, the method comprising:

encoding the first-type signaling using a Bose, Chaudhuri, Hocquenghem (BCH) code and a Low Density Parity Check (LDPC) code to generate BCH parity bits and LDPC parity bits;

puncturing at least a part of the LDPC parity bits among an LDPC codeword comprising the first-type signaling, the BCH parity bits and the LDPC parity bits; and interleaving, modulating and transmitting the LDPC codeword output from the puncturing, wherein a number of bits to be punctured by the puncturing unit is calculated based on a number of bits available for transmission of the LDPC codeword and a modulation order of the first-type signaling, and wherein the number of bits available for transmission of the LDPC codeword is calculated based on a number of cells to which the first-type signaling and the second-type signaling are mapped, a number of bits of the second-type signaling and a modulation order of the second-type signaling.

12. The method of claim 11, wherein the puncturing comprises:

calculating the number of bits available for transmission of the LDPC codeword; and calculating a number of bits which are to be temporarily punctured from the LDPC parity bits so that a number of LDPC codeword bits after the temporary puncturing of the LDPC parity bits is the same as the calculated number of bits available for transmission of the LDPC codeword.

13. The method of claim 12, wherein the number of bits available for transmission of the LDPC codeword is calculated using a following equation:

$$N_{L1post\_Available\_bits} = \left\lfloor \frac{N_{Preamble\_Available\_Cells} - N_{L1pre} / \eta_{MOD\_L1pre}}{N_{L1post\_FECFRAME}} \right\rfloor \times \eta_{MOD\_L1post},$$

where $N_{preamble\_available\_cells}$ is a number of preamble cells available for transmitting the signaling, $N_{L1pre}$ is a number of bits of the second-type signaling, $\eta_{MOD\_L1pre}$ is a modulation order of the second-type signaling, $N_{L1post\_FECFRAME}$ is a number of LDPC codewords of the first-type signaling, and $\eta_{MOD\_L1post}$ is a modulation order of the first-type signaling.

14. The method of claim 12, wherein the number of bits available for transmission of the LDPC parity bits is calculated based on the number of bits available for transmission of the LDPC codeword.

15. The method of claim 14, wherein the number of bits available for transmission of LDPC parity bits is calculated using a following equation:

$$N_{L1post\_Available\_parity} = N_{L1post\_Available\_bits} - K_{sig} - N_{bch\_parity},$$

where $N_{L1post\_available\_bits}$ is the number of bits available for transmission of the LDPC codeword, $K_{sig}$ is a number of bits of the signaling input to the encoder, and $N_{bch\_parity}$ is a number of the BCH parity bits generated by the encoding.

16. The method of claim 14, wherein the temporary puncturing of the LDPC parity bits is performed so that a number of the LDPC parity bits after the temporary puncturing is the same as the number of bits available for transmission of the LDPC parity bits.

17. The method of claim 16, wherein the number of bits to be temporarily punctured from the LDPC parity bits, $N_{punc\_temp}$, is calculated using a following equation:

$$N_{punc\_temp} = N_{ldpc\_parity\_L1post} - N_{L1post\_Available\_parity},$$

where $N_{ldpc\_parity\_L1post}$ is a number of the LDPC parity bits before the temporary puncturing, and $N_{L1post\_available\_parity}$ is the number of bits available for transmission of the LDPC parity bits.

18. The method of claim 12, wherein the puncturing comprises calculating a number of the LDPC codeword bits after puncturing based on a value which is calculated by subtracting the number of the LDPC parity bits to be temporarily punctured from the number of the LDPC codeword bits, wherein the number of the LDPC codeword bits after puncturing is a number of the LDPC codeword bits which remain after the temporary puncturing and one of additional puncturing of the LDPC parity bits or adding bits having a predetermined value to the LDPC codeword bits which remain after the temporary puncturing.

19. The method of claim 18, wherein the number of the LDPC codeword bits after the puncturing is calculated using a following equation:

$$N_{L1post} = \left\lfloor \frac{N_{L1post\_temp}}{\eta_{MOD\_L1post}} \right\rfloor \times \eta_{MOD\_L1post},$$

where $N_{L1post\_temp}$ is a value which is calculated by subtracting the number of bits to be temporarily punctured from the number of the LDPC codeword bits, and $\eta_{MOD\_L1post}$ is the modulation order of the first-type signaling.

20. The method of claim 18, wherein the puncturing comprises calculating the number of bits punctured from the LDPC parity bits using a following equation:

$$N_{punc} = N_{punc\_temp} + (N_{L1post\_temp} - N_{L1post}),$$

where $N_{punc\_temp}$ is the number of bits temporarily punctured, $N_{L1post}$ is the number of the LDPC codeword bits after puncturing, $N_{L1post\_temp}$ is a value which is calculated by subtracting the number of bits to be temporarily punctured from the number of the LDPC codeword bits.

* * * * *